United States Patent [19]
Hirai et al.

[11] Patent Number: 5,640,663
[45] Date of Patent: Jun. 17, 1997

[54] ELECTROPHOTOGRAPHIC METHOD USING A CLEANING BLADE TO REMOVE RESIDUAL TONER

[75] Inventors: Yutaka Hirai, Tokyo; Toshiyuki Komatsu, Kawasaki; Katsumi Nakagawa, Tokyo; Teruo Misumi, Toride; Tadaji Fukuda, Kawasaki, all of Japan

[73] Assignee: Canon Kabushiki Kaisha, Tokyo, Japan

[21] Appl. No.: 487,560

[22] Filed: Jun. 7, 1995

Related U.S. Application Data

[62] Division of Ser. No. 448,123, May 23, 1995, Pat. No. 5,585,149, which is a continuation of Ser. No. 351,561, Dec. 7, 1994, which is a continuation of Ser. No. 795,249, Nov. 18, 1991, which is a continuation of Ser. No. 782,098, Oct. 24, 1991, Pat. No. 5,257,316, which is a division of Ser. No. 695,428, May 3, 1991, abandoned, which is a continuation of Ser. No. 449,842, Jan. 10, 1990, which is a division of Ser. No. 214,045, Jun. 30, 1988, which is a division of Ser. No. 971,114, Dec. 19, 1978, Pat. No. 4,265,991.

[30] Foreign Application Priority Data

Dec. 22, 1977 [JP] Japan ................................. 52-154629

Jan. 23, 1978 [JP] Japan ........................................ 53-5958

[51] Int. Cl.$^6$ ...................................................... G03G 21/00
[52] U.S. Cl. ........................... 399/350; 430/125; 399/159
[58] Field of Search ........................................ 355/299, 296, 355/211; 430/125, 64, 65

[56] References Cited

U.S. PATENT DOCUMENTS 3,859,691 1/1975 Katayama et al. .

*Primary Examiner*—R. L. Moses
*Attorney, Agent, or Firm*—Fitzpatrick, Cella, Harper & Scinto

[57] ABSTRACT

An electrophotographic process is conducted by charging a cylindrical photosensitive member having a photoconductive layer of amorphous silicon containing 10 to 40 atomic % hydrogen; imagewise exposing the member to form an electrostatic latent image; developing the latent image to form a toner image; transferring the toner image to an image receiving sheet and thereafter cleaning the surface of the cylindrical member with a cleaning blade.

14 Claims, 3 Drawing Sheets

ELECTROPHOTOGRAPHIC METHOD USING A CLEANING BLADE TO REMOVE RESIDUAL TONER

This application is a division of the Rule 1.62 continuation of application Ser. No. 08/448,123, filed May 23, 1995, now U.S. Pat. No. 5,585,149, which in turn is a continuation of application Ser. No. 08/351,561, filed Dec. 7, 1994; which is a continuation of application Ser. No. 07/795,249, filed Nov. 18, 1991; which is a continuation of application Ser. No. 07/782,098, filed Oct. 24, 1991, U.S. Pat. No. 5,257,316; which is a division of application Ser. No. 07/695,428, filed May 3, 1991, now ABN.; which is a continuation of application Ser. No. 07/449,842, filed Jan. 10, 1990; which is a division of application Ser. No. 07/214,045, filed Jun. 30, 1988; which is a division of application Ser. No. 06/971,114, filed Dec. 19, 1978, now U.S. Pat. No. 4,265,991.

BACKGROUND OF THE INVENTION

1. Field of the Invention

This invention relates to an electrophotographic photosensitive member used for forming images by using an electromagnetic wave, for example, ultraviolet ray, visible ray, infrared ray, X ray, gamma ray and the like, and a process for preparing the photosensitive member.

2. Description of the Prior Art

Heretofore, there have been used inorganic photoconductive materials such as Se, CdS, ZnO and the like and organic photoconductive materials such as poly-N-vinyl-carbazole, trinitrofluorenone and the like as a photoconductive material for photoconductive layers of electrophotographic photosensitive members.

However, they all suffer from various drawbacks.

For example, Se has only a narrow spectral sensitivity range, and when the spectral sensitivity is widened by incorporating Te or As, the light fatigue increases. Se, As and Te are harmful to man. When Se photoconductive layers are subjected to a continuous and repeating corona discharge, the electric properties are deteriorated, Se photoconductive layers are of poor solvent resistance. Even if the surface of an Se photoconductive layer is covered with a surface protective coating layer, the problems are not sufficiently solved.

Se photoconductive layers may be formed in an amorphous state so as to have a high dark resistance, but crystallization of Se occurs at a temperature as low as about 65° C. so that the amorphous Se photoconductive layers easily crystallize during handling, for example, by ambient temperature or friction heat generated by rubbing with other members during image forming steps, and the dark resistance is lowered.

ZnO and CdS are usually mixed with and dispersed in an appropriate resinous binder. The resulting binder type photoconductive layer is so porous that it is adversely affected by humidity and its electric properties are lowered and further developers enter the layer resulting in lowering release property and cleaning property. In particular, when a liquid developer is used, the liquid developer penetrates the layer to enhance the above disadvantages, CdS is poisonous to man. ZnO binder type photoconductive layers have low photosensitivity, narrow spectral sensitivity range in the visible light region, remarkable light fatigue and slow photoresponse.

Electrophotographic photosensitive members comprising organic photoconductive materials are of low humidity resistance, low corona ion resistance, low cleaning property, low photosensitivity, narrow range of spectral sensitivity in the visible light region and the spectral sensitivity range is in a shorter wave length region. Some of the organic photoconductive materials cause cancer.

In order to solve the above metnioned problems, the present inventors have researched amorphous silicon (hereinafter called "a-Si") and succeeded in obtaining an electrophotographic photosensitive member free from these drawbacks.

Electric and optical properties of a-Si film vary depending upon the manufacturing processes and manufacturing conditions and the reproducibility is very poor (Journal of Electrochemical Society, Vol. 116, No. 1, pp 77–81, January 1969). For example, a-Si film produced by vaccum evaporation or sputtering contains a lot of defects such as voids so that the electrical and optical properties are adversely affected to a great extent. Therefore, a-Si had not been studied for a long time. However, in 1976 success of producing p-n junction of a-Si was reported (Applied Phisics Letter, Vol. 28, No. 2, pp. 105-7, 15 Jan. 1976). Since then, a-Si drew attentions of scientists. In addition, luminescence which can be only weakly observed in crystalline silicon (c-Si) can be observed at a high efficiency in a-Si and therefore, a-Si has been researched for solar cells (for example, U.S. Pat. No. 4,064,521.

However, a-Si developed for solar cells can not be directly used for the purpose of photoconductive layers of practical electrophotographic photosensitive members.

Solar cells take out solar energy in a form of electric current and therefore, the a-Si film should have a low dark resistance for the purpose of obtaining efficiently the electric current at a good SN ratio [photo-current (Ip)/dark current (Id)], but if the resistance is so low, the photosensitivity is lowered and the SN ratio is degraded. Therefore, the dark resistance should be $10^5$–$10^8$ ohm·cm.

However, such degree of dark resistance is so low for photoconductive layers of electrophotographic photosensitive members that such a-Si film can not be used for the photoconductive layers.

Photoconductive materials for electrophotographic apparatuses should have gamma value at a low light exposure region of nearly 1 since the incident light is a reflection light from the surface of materials to be copied and power of the light source built in electrophotographic apparatuses is usually limited.

Conventional a-Si can not satisfy the conditions necessary for electrophotographic processes.

Another report concerning a-Si discloses that when the dark resistance is increased, the photosensitivity is lowered. For example, an a-Si film having dark resistance of about $10^{10}$ ohm·cm shows a lowered photoconductive gain (photo-current per incident photon). Therefore, conventional a-Si film can not be used for electrophotography even from this point of view.

Other various properties and conditions required for photoconductive layers of electrophotographic photosensitive member such as electrostatic characteristics, corona ion resistance, solvent resistance, light fatigue resistance, humidity resistance, heat resistance, abrasion resistance, cleaning properties and the like have not been known as for a-Si films at all.

The present inventors have succeeded in producing a-Si film suitable for electrophotography by a particular procedure as detailed below.

SUMMARY OF THE INVENTION

An object of the present invention is to provide an electrophotographic photosensitive member and a process for preparing the electrophotographic photosensitive member, the process being able to be carried out in an apparatus of a closed system to avoid the undesirable effects to man and the electrophotographic member being not harmful to living things as well as man and further to environment upon the use and therefore, causing no pollution.

Another object of the present invention is to provide an electrophotographic photosensitive member which has moisture resistance, thermal resistance and constantly stable electrophotographic properties and is of all environmental type, and a process for preparing the electrophotographic photosensitive member.

A further object of the present invention is to provide an electrophotographic photosensitive member which has a high light fatigue resistance and a high corona discharging resistance, and is not deteriorated upon repeating use, and a process for preparing said member.

Still another object of the present invention is to provide an electrophotographic photosensitive member which can give high quality images having a high image density, sharp half tone and high resolution, and a process for preparing said member.

A still further object of the present invention is to provide an electrophotographic photosensitive member which has a high photosensitivity, a wide spectral sensitivity range covering almost all the visible light range and a fast photoresponse properties, and a process for preparing said member.

Still another object of the present invention is to provide an electrophotographic photosensitive member which has abrasion resistance, cleaning properties and solvent resistance and a process for preparing said member.

According to one aspect of the present invention, there is provided a process for preparing an electrophotographic photosensitive member which comprises:

(a) evacuating a pressure-reducible deposition chamber to reduce the pressure, (b) heating a substrate for electrophotography disposed in a fixed position in said deposition chamber to 50°–350° C., (c) introducing a gas containing a hydrogen atom as a constituent atom into said deposition chamber, (d) causing electric discharge in space of said deposition chamber in which at least one of silicon and a silicon compound by electric energy to ionize said gas, and (e) depositing amorphous silicon on said substrate at a deposition rate of 0.5–100 angstroms/sec. by utilizing said electric discharge while raising the temperature of said substrate from the starting temperature ($T_1$), to form an amorphous silicon photo-conductive layer of a predetermined thickness.

According to a further aspect of the present invention, there is provided a process for preparing an electrophotographic photosensitive member which comprises:

(a) evacuating a pressure-reducible deposition chamber to reduce the pressure, (b) heating a substrate for electrophotography disposed in a fixed position in said deposition chamber to 50°–350° C.

(c) introducing a gas containing a hydrogen atom as a constituent atom into said deposition chamber, (d) causing electric discharge in a space of said deposition chamber in which at least one of silicon and a silicon compound by electric energy to ionize said gas, (e) depositing amorphous silicon on said substrate at a deposition rate of 0.5–100 angstroms/sec. by utilizing said electric discharge while continuing the electric discharge for a period of time sufficient to form an amorphous silicon photoconductive layer of a predetermined thickness, and (f) while forming said amorphous silicon photoconductive layer, raising the temperature of said substrate from the starting temperature ($T_1$) to a temperature ($T_2$) and then decreasing the temperature to a temperature lower than the temperature ($T_2$).

According to a further aspect of the present inventions, there is provided a process for preparing an electrophotographic photosensitive member which comprises:

(a) evacuating a pressure-reducible deposition chamber in which a target composed of silicon and a substrate for electrophotography are disposed in fixed positions, to reduce the pressure, (b) heating said substrate to 50°–350° C., (c) introducing a gas containing a hydrogen atom as a constituent atom into said deposition chamber, (d) causing electric discharge in space of said deposition chamber in which said target is present, by electric energy to ionize said gas, and (e) depositing amorphous silicon on said substrate at a deposition rate of 0.5–100 angstroms/sec. by utilizing said electric discharge while continuing the electric discharge for a period of time sufficient to form an amorphous silicon photoconductive layer of a predetermined thickness.

According to a further aspect of the present invention, there is provided a process for preparing an electrophotographic photosensitive member which comprises:

(a) evacuating a pressure-reducible deposition chamber in which a substrate for electrophotography is disposed in a fixed position, to reduce the pressure in the deposition chamber, (b) heating said substrate, (c) introducing a rare gas, not less than 10% by volume of a silane gas based on the rare gas, and a gas containing an element of Group IIIA or VA of the Periodic Table as a constituent atom into said deposition chamber, and causing electric discharge with an electric current density of 0.1–10 mA/cm² and a voltage of 100–5000 V in space of said deposition chamber by electric energy to ionize said gases, and (d) depositing amorphous silicon on said substrate at a deposition rate of 0.5–100 angstroms/sec. by utilizing said electric discharge while raising the temperature of said substrate from the starting temperature ($T_1$), to form an amorphous silicon photoconductive layer.

According to a further aspect of the present invention, there is provided a process for preparing an electrophotographic photosensitive member which comprises:

(a) evacuating a pressure-reducible deposition chamber in which a substrate for electrophotography is disposed in a fixed position, to reduce the pressure in the deposition chamber, (b) heating said substrate, (c) introducing a rare gas, not less than 10% by volume of a silane gas based on the rare gas, and a gas containing an element of Group IIIA or VA of the Periodic Table as a constituent atom into said deposition chamber, and causing electric discharge with an electric current density of 0.1–10 mA/cm² and a voltage of 100–5000 V in space of said deposition chamber by electric energy to ionize said gases, (d) depositing amorphous silicon on said substrate at a deposition rate of 0.5–100 angstroms/sec. by utilizing said electric discharge to form an amorphous silicon photoconductive layer, and (e) while forming said amorphous silicon layer, raising the temperature of said substrate from the starting temperature ($T_1$) to a temperature ($T_2$) and then decreasing the temperature to a temperature lower than the temperature ($T_2$).

According to a further aspect of the present invention, there is provided a process for preparing an electrophotographic: photosensitive member which comprises:

(a) evacuating a pressure-reducible deposition chamber in which a substrate for electrophotography is disposed in a fixed position, to reduce the pressure in the deposition chamber, (b) heating said substrate, (c) introducing a rare gas, not less than 10% by volume of a silane gas based on the rare gas, and a gas containing an element of Group IIIA or VA of the Periodic Table as a constituent atom into said deposition chamber, and causing electric discharge with an electric power of 0.1–300 W in space of said deposition chamber by electric energy to ionize said gas mixture, (d) depositing amorphous silicon on said substrate at a deposition rate of 0.5–100 angstroms/sec. by utilizing said electric discharge while raising the temperature of said substrate from the starting temperature ($T_1$) to form an amorphous silicon photoconductive layer.

According to a further aspect of the present invention, there is provided a process for preparing an electrophotographic photosensitive member which comprises:

(a) evacuating a pressure-reducible deposition chamber in which a substrate for electrophotography is disposed in a fixed position, to reduce the pressure in the deposition chamber, (b) heating said substrate, (c) introducing a rare gas, not less than 10% by volume of a silane gas based on the rare gas, and a gas containing an element of Group IIIA of or VA of the Periodic Table as a constituent atom into said deposition chamber, and causing electric discharge with an electric power of 0.1–300 in space of said deposition chamber by electric energy to ionize said gas mixture, (d) depositing amorphous silicon on said substrate at a deposition rate of 0.5–100 angstroms/sec. by utilizing said electric discharge to form an amorphous silicon photoconductive layer, and (e) while forming said amorphous silicon layer, raising the temperature of said substrate from the starting temperature ($T_1$) to a temperature ($T_2$) and the decreasing the temperature to a temperature lower than the temperature ($T_2$).

According to a further process of the present invention, there is provided a process for preparing an electrophotographic photosensitive member which comprises:

(a) evacuating a pressure-reducible deposition chamber in which a substrate for electrophotography is disposed, to reduce the pressure in the deposition chamber, (b) heating said substrate to 50°–350° C., (c) introducing a rare gas, not less than 10% by volume of a silane gas based on the rare gas, and a gas containing an element of Group IIIA or VA of the Periodic Table as a constituent atom into said deposition chamber, and causing electric discharge with an electric current density of 0.1–10 mA/cm$^2$ and a voltage of 100–5000 V in space of said deposition chamber by electric energy to ionize said gas mixture, and (d) depositing amorphous silicon on said substrate at a deposition rate of 0.5–100 angstroms/sec. by utilizing said electric discharge to form an amorphous silicon photoconductive layer.

According to a further aspect of the present invention, there is provided a process for preparing an electrophotographic photosensitive member which comprises:

(a) evacuating a pressure-reducible deposition chamber in which a substrate for electrophotography is disposed, to reduce the pressure in the deposition chamber, (b) heating said substrate to 50°–350° C., (c) introducing a rare gas, not less than 10% by volume of a silane gas based on the rare gas, and a gas containing an element of Group IIIA or VA of the Periodic Table as a constituent atom into said deposition chamber, and causing electric discharge with an electric power of 0.1–300 W in space of said deposition chamber by electric energy to ionize said gas mixture, and (d) depositing amorphous silicon on said substrate at a deposition rate of 0.5–100 angstroms/sec. by utilizing said electric discharge to form an amorphous silicon photoconductive layer.

According to a further aspect of the present invention, there is provided a process for preparing an electrophotographic photosensitive member which comprises:

(a) evacuating a pressure-reducible deposition chamber in which a substrate for electrophotography is disposed, to reduce the pressure in the deposition chamber, (b) heating said substrate to 50°–350° C., (c) introducing a rare gas and not less than 10% by volume of a silane gas based on the rare gas into said deposition chamber, and causing electric discharge with an electric current density of 0.1–10 mA/cm$^2$ and a voltage of 100–5000 V in space of said deposition chamber by electric energy to ionize said gases, and (d) depositing amorphous silicon on said substrate at a deposition rate of 0.5–100 angstroms/sec. by utilizing said electric discharge to form an amorphous silicon photoconductive layer.

According to a further aspect of the present invention, there is provided a process for preparing an electrophotographic photosensitive member which comprises:

(a) evacuating a pressure-reducible deposition chamber in which a substrate for electrophotography is disposed, to reduce the pressure in the deposition chamber, (b) heating said substrate to 50°–350° C., (c) introducing a rare gas and not less than 10% by volume of a silane gas based on the rare gas into said deposition chamber, and causing electric discharge with an electric power of 0.1–300 W in space of said deposition chamber by electric energy to ionize said gases, and (d) depositing amorphous silicon on said substrate at a depositon rate of 0.5–100 angstroms/sec. by utilizing said electric discharge to form an amorphous silicon photoconductive layer.

According to a further aspect of the present invention, there is provided a process for preparing an electrophotographic photosensitive member which comprises:

(a) evacuating a pressure-reducible deposition chamber in which a target composed of silicon and a substrate for electrophotography are disposed in fixed positions, to reduce the pressure, (b) heating said substrate to 50°–350° C., (c) introducing a gas containing a hydrogen atom as a constituent atom, a rare gas and a gas containing an element of Group IIIA or VA of the Periodic Table as a constituent atom into said deposition chamber, and causing electric discharge in space of said deposition chamber with an electric current density of 0.1–10 mA/cm$^2$ and a voltage of 100–5000 V by electric energy to ionize said gases, and (d) depositing amorphous silicon on said substrate at a deposition rate of 0.5–100 angstroms/sec. by utilizing said electric discharge to form an amorphous silicon photoconductive layer.

According to a further aspect of the present invention, there is provided an electrophotographic photosensitive member comprising a substrate for electrophotography, a barrier layer capable of preventing injection of electric carrier from said substrate side when the charging treatment is applied to said photosensitive member, and a photoconductive layer overlying said barrier layer, said photoconductive layer being formed of amorphous silicon by utilizing electric discharge, containing 10–40 atomic percent of hydrogen and being 5–80 microns in thickness.

According to a further aspect of the present invention, there is provided an electrophotographic photosensitive member comprising a substrate for electrophotography; a photoconductive layer, said photoconductive layer being formed of amorphous silicon by utilizing electric discharge, containing 10–40 atomic percent of hydrogen and being 5–80 microns in thickness; and a covering layer overlying the surface of said photoconductive layer, said covering layer being 0.5–70 microns in thickness.

According to a further aspect of the present invention, there is provided an electrophotographic photosensitive member comprising a substrate for electrophotography and a photoconductive layer, said photoconductive layer being formed of amorphous silicon by utilizing electric discharge, containing 10–40 atomic percent of hydrogen and being 5–80 microns in thickness.

DESCRIPTION OF THE PREFERRED EMBODIMENT

Figure 1:
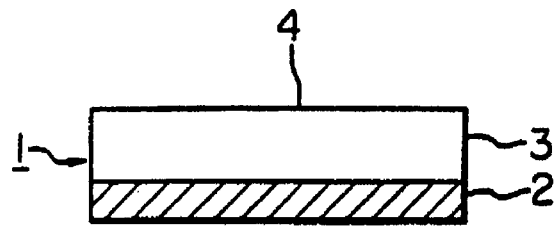
FIG. 1 and FIG. 2 are schematic cross sectional views of embodiments of electrophotographic photosensitive members according to the present invention.
Figure 2:
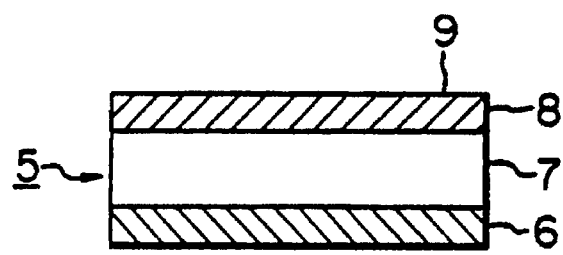

FIG. 1 and FIG. 2 show representative structures of electrophotographic photosensitive members according to the present invention.

Referring to FIG. 1, electrophotographic photosensitive member 1 is composed of substrate for electrophotography 2 and photoconductive layer 3 mainly composed of amorphous silicon (hereinafter called a-Si), and the photoconductive layer 3 has free surface 4 which becomes an image bearing surface.

Substrate 2 may be electroconductive or electrically insulating. As a conductive substrate, there may be mentioned stainless steel, Al, Cr, Mo, Au, Ir, Nb, Ta, V, Ti, Pt, Pd and the like and alloys thereof. As an electrically insulating substrate, synthetic resin films or sheets such as polyesters, polyethylenes, polycarbonates, cellulose triacetate, polypropylene, polyvinyl chloride, polyvinylidene chloride, polystyrene, polyamides and the like glass, ceramics, paper and the like. At least one surface of these electrically insulating substrates is preferably conductivized.

For example, in case of glass, its surface is conductivized with $In_2O_3$, $SnO_2$ or like. In case of synthetic resin film such as polyester film and the like, its surface is conductivized with Al, Ag, Pb, Zn, Ni, Au, Cr, Mo, Ir, Nb, Ta, V, Ti, Pt and the like by vapor deposition, electron beam vapor deposition, sputtering and the like, or by laminating the surface with such metal.

As a shape of the substrate, there may be used drum, belt, plate and other optional shapes. In case of a continuous high copying, an endless belt or drum shape is preferable.

The thickness of the substrate is optional. When a flexible electrophotographic photosensitive member is desired, a thickness as thin as possible is preferable, but it is usually not less than 10 microns from manufacturing, handling and mechanical strength points of view.

a-Si photoconductive layer 3 is prepared on substrate 2 with silicon and/or silane and the like silicon compound by glow discharge, sputtering, ion plating, ion implantation, and the like. These manufacturing methods may be optionally selected depending upon manufacturing conditions, capital investment, manufacture scales, electrophotographic properties and the like. Glow discharge is preferably used because controlling for obtaining desirable electrophotographic properties is relatively easy and impurities of Group III or Group V of the Periodic Table can be introduced into the a-Si layer in a substitutional type for the purpose of controlling the characteristics.

Further, according to the present invention, glow discharge and sputtering in combination can be conducted in the same system to form a-Si layer and this is a very efficient and effective method.

a-Si photoconductive layer 3 is controlled by incorporating H (hydrogen) (as the result, H is contained in a-Si layer) so as to obtain desirable dark electrical resistivity and photoconductive gain suitable for photoconductive layers of electrophotographic photosensitive members.

In the present invention, "H is contained in a-Si layer" means one of or a combination of the state, i.e. "H is bonded to Si" and ionized H is weakly bonded to Si in the layer", and "present in the layer in a form of $H_2$".

In order to incorporate H in a-Si photoconductive layer 3 resulting in that H is contained in a-Si layer, a silicon compound such as silanes, for example, $SiH_4$, $Si_2H_6$, and the like or $H_2$ may be introduced to an apparatus for producing a photoconductive layer 3 upon producing the photoconductive layer 3, and then heat-decomposed or subjected to glow discharge to decompose the compound or $H_2$ and incorporate H in the a-Si layer as the layer grows, or H may be incorporate in the a-Si layer by ion implantation.

According to the present inventor's opinion, content of H in an a-Si photoconductive layer 3 is a very important factor affecting whether the a-Si photoconductive layer is suitable for electrography.

As a photoconductive layer for electrophotographic photosensitive members, amount of H in an a-Si layer is usually 10–40 atomic % preferably, 15–30 atomic %.

Any theoretical reason why content of H in a-Si layer is to be the above-mentioned range is not yet clear, but when the content of H is outside of the above range, a photoconductive layer made of such a-Si of an electrophotographic photosensitive member has a low dark resistance which is not suitable for the photoconductive layer and the photosensitivity is very low or is hardly observed, and further increase in carrier caused by light irradiation is very little.

For the purpose of incorporating H in a-Si layer (i.e. causing a state that H is contained in a-Si layer), when glow discharge is employed, a silicon hydride gas such as $SiH_4$, $Si_2H_6$ and the like may be used as the starting material for forming the a-Si layer, and therefore, H is automatically incorporated in the a-Si layer upon formation of the a-Si layer by decomposition of such silicon hydride. In order to carry out this incorporation of H more efficiently, $H_2$ gas may be introduced into the system where glow discharge is carried out to form a-Si layer.

Where sputtering is employed, in a rare gas such as Ar or a gas mixture atmosphere containing a rare gas sputtering is carried out with Si as a target while introducing $H_2$ gas into the system or introducing silicon hydride gas such as $SiH_4$, $Si_2H_6$ and the like or introducing $B_2H_6$, $PH_3$ or the like gas which can serve to doping with impurities.

Controlling an amount of H to be contained in a-Si layer can be effected by controlling the substrate temperature and/or an amount introduced into the system of a starting material used for incorporating H.

a-Si layer can be made intrinsic by appropriately doping with impurities when prepared and the type of conductivity can be controlled. Therefore, polarity of charging upon forming electrostatic images on an electrophotographic photosensitive member thus prepared can be optionally selected, that is, positive or negative polarity can be optionally selected.

In case of conventional Se photoconductive layer, only p-type or at most intrinsic type (i-type) of photoconductive layer can be obtained by controlling the substrate temperature, type of impurities, amount of dopant and other preparation conditions, and moreover, even when the p-type is prepared, the substrate temperature should be strictly controlled. In view of the foregoing, the a-Si layer is much better and more convenient than conventional Se photoconductive layers.

As an impurity used for doping a-Si layer to make the a-Si layer p-type there may be mentioned elements of Group IIIA of the Periodic Table such as B, Al, Ga, In, Tl and the like, and as an impurity for doping a-Si layer to make the a-Si layer n-type, there may be mentioned elements of Group VA of the Periodic Table such as N, P, As, Sb, Bi and the like.

These impurities are contained-in the a-Si layer in an order of ppm. so that problem of pollution is not so serious as that for a main component of a photoconductive layer. However, it is naturally preferable to pay attention to such problem of pollution. From this viewpoint, B, As, P and Sb are the most appropriate taking into consideration electrical and optical characteristics of a-Si photoconductive layers to be produced.

An amount of impurity with which a-Si layers are doped may be appropriately selected depending upon electrical and optical characteristics of the a-Si photoconductive layer. In case of impurities of Group IIIA of the Periodic Table, the amount is usually $10^{-6}$–$10^{-3}$ atomic %, preferably, $10^{-5}$–$10^{-4}$ atomic %, and in case of impurites of Group VA of the Periodic Table, the amount is usually $10^{-8}$–$10^{-5}$ atomic %, preferably $10^{-8}$–$10^{-7}$ atomic %.

The a-Si layers may be doped with these impurities by various methods depending upon the type of method for preparing the a-Si layer. These will be mentioned later in detail.

Referring to FIG. 1, electrophotographic photosensitive member 1 contains a-Si photoconductive layer 3 which has a free surface 4. In case of an electrophotographic photosensitive member to the surface of which charging is applied for the purpose of forming electrostatic images, it is preferable to dispose between a-Si photoconductive layer 3 and substrate 2 a barrier layer capable of suppressing injection of carriers from the side of substrate 2 upon charging for producing electrostatic images.

As a material for such barrier layer, there may be selected insulating inorganic oxides such as $Al_2O_3$, SiO, $SiO_2$ and the like and insulating organic compounds such as polyethylene, polycarbonate, polyurethane, polyparaxylylene and the like, Au, Ir, Pt, Rh, Pd, Mo and the like.

Thickness of the a-Si photoconductive layer is selected taking into consideration its electrostatic characteristic, using conditions, for example, whether flexibility is required. It is usually 5–80 microns, preferably, 10–70 microns, and more preferably, 10–50 microns.

As shown in FIG. 1, the a-Si photoconductive layer surface is directly exposed and refractive index (n) of a-Si layer is as high as about 3.3–3.9 and therefore, light reflection at the surface is apt to occur upon exposure as compared with conventional photoconductive layers, and light amount absorbed in a photoconductive layer is lowered resulting in increase in loss of light. In order to reduce the loss of light, it is helpful to dispose an antireflection layer on an a-Si photoconductive layer.

Materials for the antireflection layer are selected taking the following conditions into consideration.

i) No adverse effect on the a-Si photoconductive layer;

ii) High antireflecting property; and iii) Electrophotographic characteristics such as electric resistance higher than a certain value, transparent to a light absorbed to the photoconductive layer, good solvent resistance when used for a liquid developing process, causing no deterioration of the already prepared a-Si photoconductive layer upon preparing the antireflection layer, and the like.

Further, for the purpose of facilitating antireflection, it is desirable to select refractive index of the material which is between that of the a-Si layer and that of air. This will be clear from a simple calculation of optics.

Thickness of the antireflection layer is preferably $\lambda/4\sqrt{n}$ where n is refractive index of the a-Si layer and $\lambda$ is wavelength of exposure light, or (2k+1) times of $\lambda/4\sqrt{n}$ where k is an integer such as 0, 1, 2, 3, . . . , most preferably $\lambda/4\sqrt{n}$ taking into consideration of light absorption of the antireflection layer itself.

Taking these optical conditions, thickness of the antireflection layer is preferably 50–100 mµ assuming that wavelength of the exposure light is roughly in the wavelength region of visible light.

Representative materials for an antireflection layer are inorganic fluorides and oxides such as $MgF_2$, $Al_2O_3$, $ZrO_2$, $TiO_2$, ZnS, $CeO_2$, $CeF_2$, $SiO_2$, SiO, $Ta_2O_5$, $AlF_3.3NaF$ and the like, and organic compounds such as polyvinyl chloride, polyamide resins, polyimide resins, polyvinylidene fluoride, melamine resins, epoxy resins, phenolic resins, cellulose acetate and the like.

The surface of a-Si photoconductive layer 3 may be provided with a surface coating layer such as a protective layer, an electrically insulating layer and the like as in conventional electrophotographic photosensitive members. FIG. 2 shows such electrophotographic photosensitive member having a covering layer.

Now referring to FIG. 2, electrophotographic photosensitive member 5 has covering layer 8 on a-Si photoconductive layer 7, but other structure is the same as that of FIG. 1.

Characteristics required of covering layer 8 vary depending upon each electrophotographic process. For example, when an electrophotographic process such as U.S. Pat. Nos. 3,666,363 and 3,734,609 is used, it is required that covering layer 8 is electrically insulating and has a sufficient electrostatic charge retaining property when subjected to charging and a thickness thicker than a certain thickness. However, when a Carlson type electrophotographic process is used, a very thin covering layer 8 is required since potentials at the light portions of electrostatic images are preferably very low. Covering layer 8 is to be prepared so as to satisfy the desired electrical characteristics and furthermore, the following are taken into consideration not adversely affecting a-Si photoconductive layers chemically and physically, electrical contact and adhesivity with a-Si photoconductive layer, moisture resistance, abrasion resistance and cleaning properties.

Representative materials for a covering layer are synthetic resins such as polyethylene terephthalate, polycarbonate, polypropylene, polyvinyl chloride, polyvinylidene chloride, polyvinyl alcohol, polystyrene, polyamides, polyethylene tetrafluoride, polyethylene trifluoride chloride, polyvinyl fluoride, polyvinylidene fluoride, copolymers of propylene hexafluoride and ethylene tetrafluoride, copolymers of ethylene trifluoride and vinylidene fluoride, polybutene, polyvinyl butyral, polyurethane and the like, and cellulose derivatives such as the diacetate, triacetate and the like.

These synthetic resin and cellulose derivative in a form of film may be adhered to the surface of the a-Si photoconductive layer, or a coating liquid of these materials is coated on an a-Si photoconductive layer 5. Thickness of the covering layer may be appropriately selected depend-in upon the required characteristics and type of material, but it is usually 0.5–70 microns. When the covering layer is used as a protective layer, the thickness is usually, for example not more than 10 microns and when it is used as an electrically insulating layer, the thickness is usually, for example, not less than 10 microns though this value, 10 microns is not critical, but only an example because such value varies depending upon type of the material, the electrophotographic process and structure of the electrophotographic photosensitive member.

The covering layer 8 may also serve as an antireflection layer and thus the function is effectively widened.

Preparation of electrophotographic photosensitive member of the present invention is exemplified by a glow discharge process and a sputtering process below.

Figure 3:
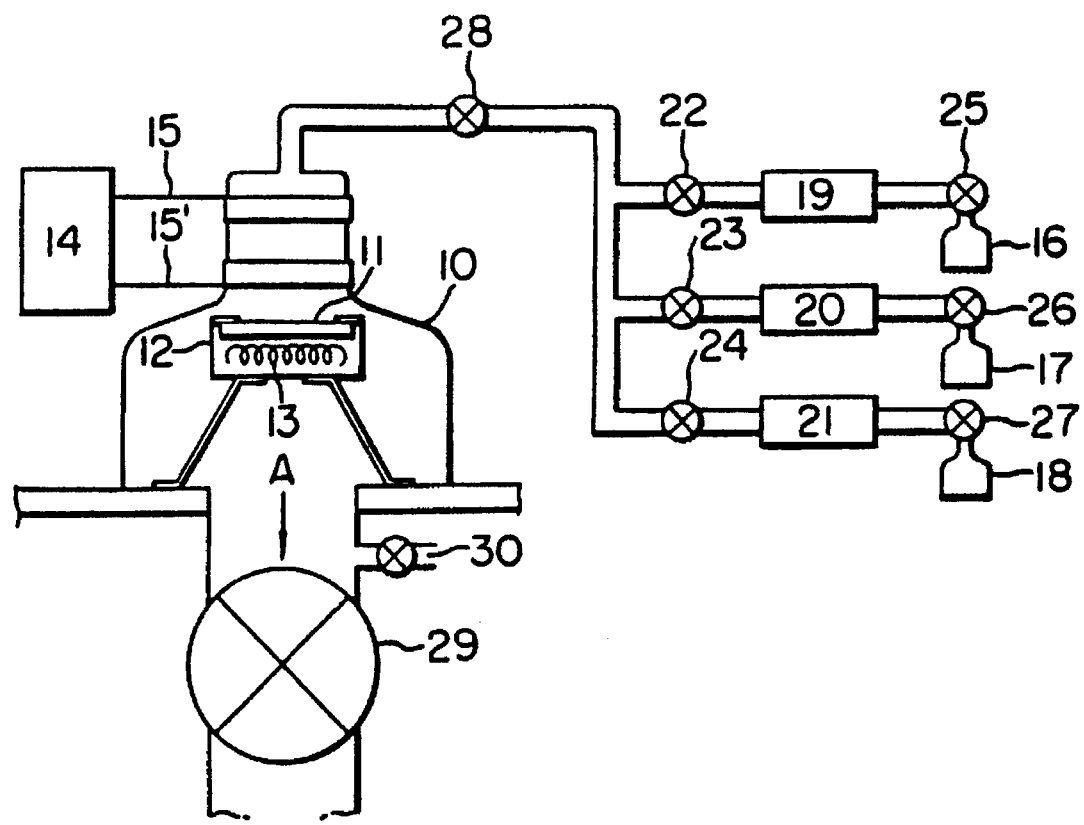
FIG. 3, FIG. 4 and FIG. 5 are schematic diagrams of apparatuses suitable for conducting the process for preparing an electrophotographic photosensitive member according to the present invention.

Referring to FIG. 3, there is illustrated a diagrammatical glow discharge process of capacitance type for producing an electrophotographic photosensitive member.

Glow discharge deposition chamber 10 contains substrate 11 fixed to fixing member 12 and an a-Si photoconductive layer is formed on substrate 11. Under substrate 11 is disposed heater 13 for heating substrate 11. At upper part of deposition chamber 10 are wound capacitance type electrodes 15 and 15' connected to high frequency power source 14. When the power source 14 is turned on, a high frequency voltage is applied to electrodes 15 and 15' to cause glow discharge in deposition chamber 10.

To the top portion of deposition chamber 10 is connected a gas introducing conduit to introduce gases from gas pressure vessels 16, 17 and 18 into deposition chamber 10 when required.

Flow meters 19, 20 and 21, flow rate controlling valves 22, 23 and 24, valves 25, 26 and 27 and auxiliary valve 28 are provided.

The lower portion of depositon chamber 10 is connected to an exhausting device (not shown) through main valve 29. Valve 30 serves to break vacuum in deposition chamber 10.

Cleaned substrate 11 is fixed to fixing member 12 with the cleaned surface kept upward.

Surface of substrate 11 may be cleaned as shown below. It can be cleaned with an alkali or acid, (a kind of chemical treatment), or by disposing a substrate cleaned to some extent in deposition chamber 11 at a fixed portion and then applying glow discharge. In the latter case, cleaning substrate 11 and formation of an a-Si photoconductive layer can be carried out in the same system without breaking vacuum and thereby it can be avoided that dirty matters and impurities attach to the cleaned surface. After fixing substrate 11 to fixing member 12, main valve 29 is fully opened to evacuate deposition chamber 10 to bring the pressure down to about $10^{-5}$ Torr. Then heater 13 starts to heat substrate 11 up to a predetermined temperature, and the temperature is kept while auxiliary valve 28 is fully opened, and then valve 25 of gas pressure vessel 16 and valve 26 of gas pressure vessel 17 are fully opened. Gas pressure vessel 16 is, for example, for a diluting gas such as Ar and gas pressure vessel 17 is for a gas forming a-Si, for example, silicon hydride gas such as $SiH_4$, $Si_2H_6$, $Si_4H_{10}$ or their mixture. Pressure vessel 18 may be used, if desired, for storing a gas capable of incorporating impurities in an a-Si photoconductive layer, for example, $PH_3$, $P_2H_4$, $B_2H_6$ and the like. Flow rate controlling valves 22 and 23 are gradually opened while observing flow meters 19 and 20 to introduce a diluent gas, e.g., Ar, and a gas for forming a-Si, e.g., $SiH_4$ into deposition chamber 10. The diluting gas is not always necessary, but only $SiH_4$ may be introduced into the system. When Ar gas is mixed with a gas for forming a-Si, e.g. $SiH_4$, and then introduced, the amount ratio may be determined depending upon each particular situation. Usually the gas for forming a-Si is more than 10 vol. % based on the diluting gas. As the diluting gas, a rare gas such as He may be used. When gases are introduced from pressure vessels 16 and 17 into deposition chamber 10, main valve 29 is adjusted to keep a particular vacuum degree, usually, an a-Si layer forming gas of $10^{-12}$–3 Torr. Then, to electrodes 15 and 15' is applied a high frequency voltage, for example, 0.2–30 MHz, from high frequency power source 14 to cause glow discharge in deposition chamber 10, and $SiH_4$ is decomposed to deposit Si on substrate 11 to form an a-Si layer.

Impurities may be introduced into an a-Si photoconductive layer to be formed by introducing a gas from pressure vessel 18 into deposition chamber 10 upon forming an a-Si photoconductive layer. By controlling valve 24, an amount of gas introduced into deposition chamber 10 from pressure vessel 18 can be controlled. Therefore, an amount of impurities incorporated in an a-Si photoconductive layer can be optionally controlled and in addition, the amount may be varied in the direction of thickness of the a-Si photoconductive layer.

In FIG. 3, the glow discharge deposition apparatus uses a glow discharge process of RF (radio frequency) capacitance type, but in place of said type process, there may be used a glow discharge process of RF inductance type or DC diode type. Electrodes for glow discharge may be disposed in or outside of deposition chamber 10.

In order to efficiently carry out glow discharge in a glow discharge apparatus of capacitance type as shown in FIG. 3, current density is usually 0.1–10 mA/cm$^2$, preferably 0.1–5 mA/cm$^2$, more preferably, 1–5 mA/cm$^2$, of AC or DC, and further the voltage is usually 100–5000 V, preferably 300–5000 V, so as to obtain a sufficient power.

Characteristics of an a-Si photoconductive layer depend on a temperature of substrate to a great extent and therefore, it is preferable to control the temperature strictly. The temperature of substrate according to the present invention is usually 50°–350° C., preferably 100°–200° C. so as to obtain an a-Si photoconductive layer for electrophotography having desirable characteristics. In addition, the substrate temperature may be changed continuously or batchwise to produce desirable characteristics. Growing speed of the a-Si layer also affects physical properties of the resulting a-Si layer to a great extent, and according to the present invention, it is usually 0.5–100 Å/sec., preferably 1–50 Å/sec.

Figure 4:
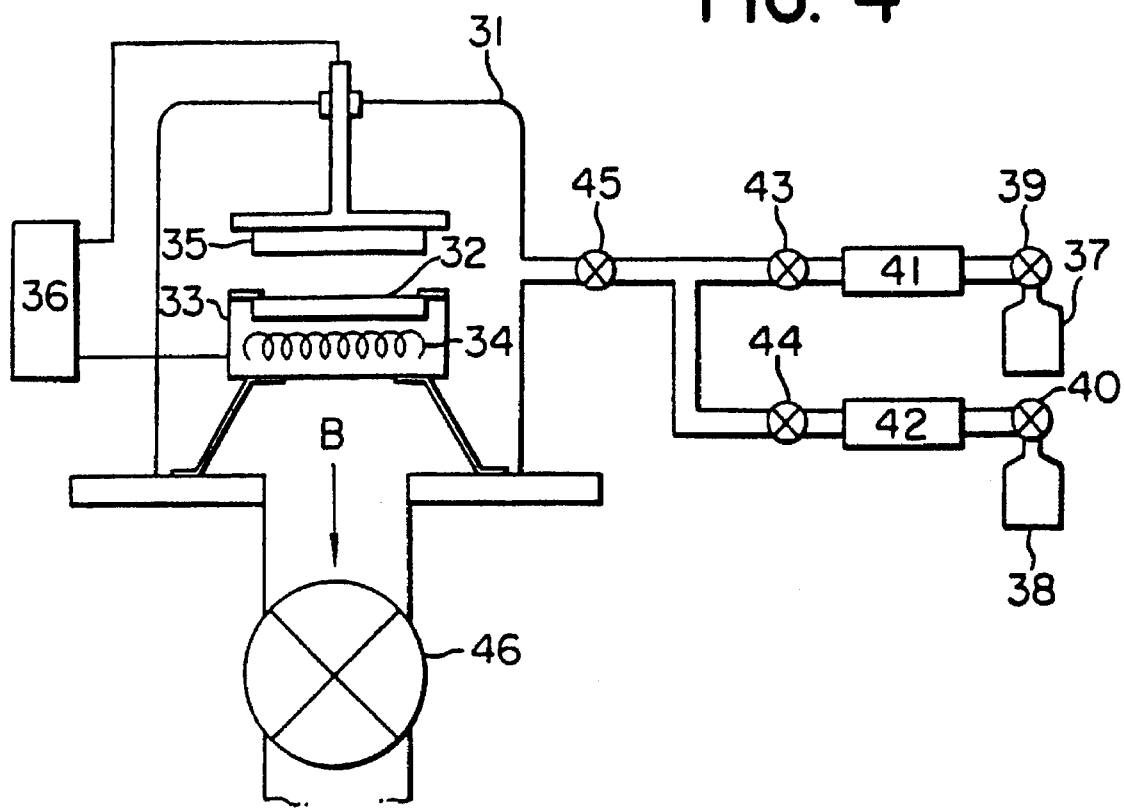

FIG. 4 shows a diagrammatical apparatus for producing electrophotographic photosensitive members by sputtering.

Deposition chamber 31 contains substrate 32 fixed to fixing member 33 which is conductive and is electrically insulated from deposition chamber 31. Heater 34 is disposed under substarte 32, which is to be heated by heater 34. Over substrate 32 and facing substrate 32, there is disposed polycrystal or single crystal silicon target 35. High frequency voltage is applied between fixing member 33 and silicon target 35 by high frequency power source 36.

To deposition chamber 31 are connected gas pressure vessels 37 and 38 through valves 39 and 40, flow meters 41 and 42, flow rate controlling valves 43 and 44, and auxiliary valve 45. Gases may be introduced into deposition chamber 30 when wanted.

An a-Si photoconductive layer can be formed on substrate 32 by the apparatus of FIG. 4 as shown below. Deposition chamber 31 is evacuated to the direction of arrow B to obtain an appropriate, degree of vacuum. Then substrate 32 is heated to a particular temperature by heater 34.

When sputtering is employed, the temperature of substrate 32 is usually 50°–350° C., preferably, 100°–200° C. This substrate temperature affects growing speed of the a-Si layer, structure of the layer, void, physical properties of the resulting a-Si layer, and therefore, a strict control is necessary.

The substrate temperature may be kept constant during formation of an a-Si layer, or may be raised or lowered or both raised and lowered in combination as the a-Si layer grows. For example, at the beginning of formation of an a-Si layer a substrate temperature is kept at a relatively low temperature $T_1$ and when the a-Si layer grows to some extent, the substrate temperature is raised up to $T_2$ ($T_2 > T_1$) during forming the a-Si layer, and then at the end of the a-Si layer formation the substrate temperature is lowered down to a temperature $T_3$ lower than $T_2$. In this way, electrical and optical properties of the a-Si photoconductive layer can be constantly or continuously changed in the direction of thickness of the layer.

Since the layer growing speed of a-Si is slower than, for example, Se, there is a fear that the a-Si formed at the beginning (a-Si near the substrate) may change its original characteristics before the layer formation is completed where the layer is thick. Therefore, it is preferable to form layer by raising the substrate temperature from the beginning to the end so as to obtain an a-Si layer having uniform characteristics in the direction of thickness.

The substrate temperature controlling method may also be employed when glow discharge process is carried out.

After detecting that the temperature of substrate 32 is heated to a predetermined temperature, auxiliary valve 45, valves 39 and 40 are fully opened and then while main valve 46 and flow rate controlling 44 are controlled, silicon hydride gas such as SiH$_4$ and the like and/or hydrogen gas are introduced from pressure vessel 38 into deposition chamber 31 resulting in decrease in degree of vacuum and then the resulting degree of vacuum is kept.

Then, flow rate controlling valve 43 is opened and an atmosphere gas such as Ar gas is introduced from pressure vessel 37 into deposition chamber 31 until the degree of vacuum decreases. The flow rates of silicon hydride gas, hydrogen gas, and the atmosphere gas such as Ar are appropriately determined so as to obtain desired physical properties of the a-Si photoconductive layer. For example, pressure of a mixture of an atmosphere gas and hydrogen gas in deposition chamber is usually 10$^{-3}$–10$^{-1}$ Torr., preferably 5×10$^{-3}$–3×10$^{-2}$. In place of Ar gas, there may be used other rare gases such as He gas.

After an atmosphere gas such as Ar and the like, and H$_2$ gas or silicon hydride gas are introduced into deposition chamber 31, a high frequency voltage is applied between substrate 32 is applied between fixing member 33 and silicon target 35 from a high frequency power source 36 at a predetermined frequency and voltage to discharge and the resulting atmosphere gas ion such as Ar ion serves to sputter silicon of the silicon target to form an a-Si layer on substrate 32.

FIG. 4 is explained concerning sputtering by a high frequency discharge, but there may be used there sputtering by DC discharge. In case of sputtering by high frequency discharge, the frequency is usually 0.2–30 MHz, preferably 5–20 MHz, and the current density of discharge is usually 0.1–10 mA/cm$^2$, preferably 0.1–5 mA/cm$^2$, more preferably 1–5 mA/cm$^2$. In addition, for the purpose of obtaining sufficient power, the voltage is usually controlled to 100–5000 V, preferably 300–5000 V.

A growing speed of an a-Si layer by sputtering is mainly determined by the substrate temperature and discharging conditions, and affects physical properties of the resulting a-Si layer to a great extent. A growing speed of an a-Si layer for attaining the purpose of the present invention is usually 0.5–100 Å/sec., preferably 1–50 Å/sec. In a sputtering method as well as a glow discharge method, it is possible to control the resulting a-Si photoconductive layer to n-type or p-type by doping with impurities. Introduction of impurities in a sputtering method is similar to that in a glow discharge method. For example, a material such as PH$_3$, P$_2$H$_4$, B$_2$H$_6$ and the like is introduced into deposition chamber in a gaseous form upon producing an a-Si layer and the a-Si layer is doped with P or B as an impurity. Further, impurities can be introduced into an already produced a-Si layer by an ion implantation method and it is possible to control the very thin surface layer of the a-Si layer to a particular conductive type.

Figure 5:
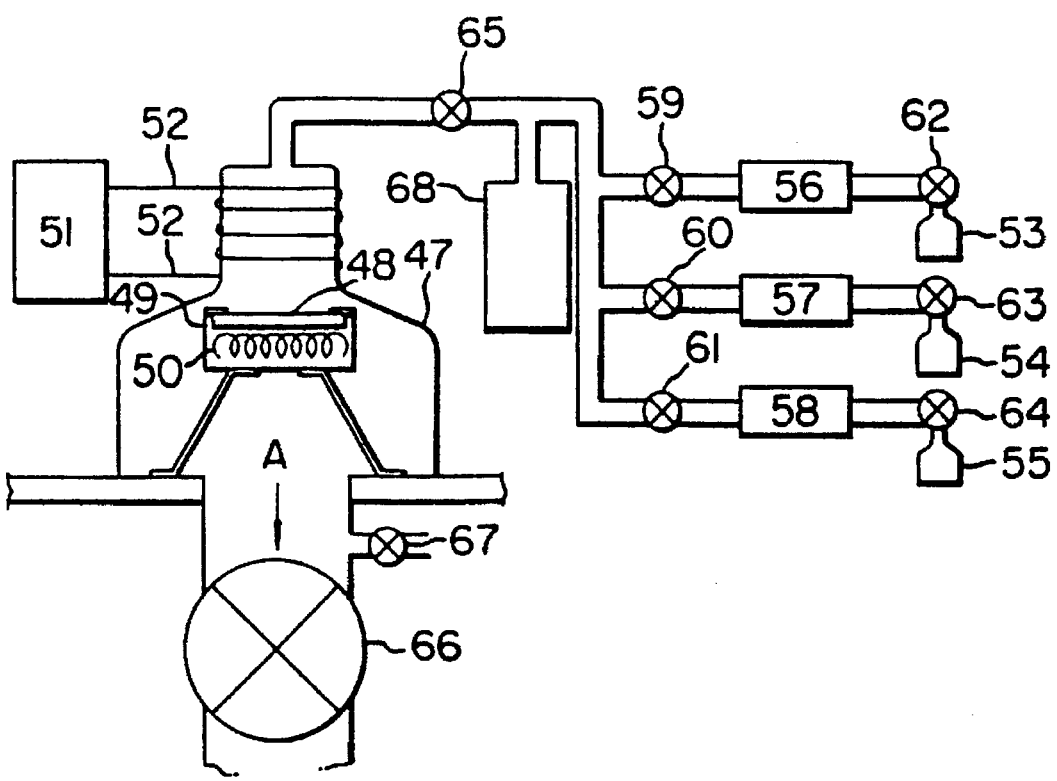

FIG. 5 illustrates diagrammatically a glow discharge deposition apparatus for producing an electrophotographic photosensitive member by inductance type glow discharge.

Glow discharge deposition chamber 47 contains substrate 48 on which an a-Si photoconductive layer is formed. Substrate 48 is fixed to fixing member 49. Under substrate 48 is disposed heater 50 to heat substrate 48. Inductance type electrode 52 connected to a high frequency power source 51 is wound around the upper portion of deposition chamber 47. When the power source is on, high frequency wave is applied to the electrode 52 to cause glow discharge in deposition chamber 47. To the top of deposition chamber 47 is connected a gas introducing pipe capable of introducing gases in gas pressure vessels 53, 54 and 55 when required. The gas introducing pipe is equipped with flow meters 56, 57 and 58, flow rate controlling valves 59, 60 and 61, valves 62, 63 and 64 and auxiliary valve 65.

The bottom portion of deposition chamber 47 is connected to an exhausting device (not shown) through main valve 66. Valve 67 is used for breaking vacuum in deposition chamber 47. Gases from pressure vessels 53, 54 and 55 are not directly introduced into deposition chamber 47, but are mixed in advance in this mixing tank 68 and then the resulting mixture gas is introduced into deposition chamber 47. In this way, when the gases are once introduced into mixing tank 68 and mixed at a predetermined ratio and then the resulting mixture is introduced into deposition chamber 47 from mixing tank 68, it is possible to introduce always a gas mixture of a constant mixing ratio into deposition chamber 47 at any time. This is very advantageous.

An a-Si photoconductive layer having a desired characteristics is formed on substrate 48 as shown below.

Cleaned substrate 48 is fixed to fixing member 49 with the cleaned surface upward. Cleaning the surface of substrate 48 is conducted as in FIG. 3.

Deposition chamber 47 and mixing tank 68 are evacuated while main valve 66 and auxiliary valve 65 are kept fully open. The pressure in the system is brought down to about $10^{-5}$ Torr., and then substrate 48 is heated to a predetermined temperature by heater 50 and the temperature is kept.

Then auxiliary valve is closed and valves 62 and 63 are fully opened. Gas pressure vessel 53 contains a diluting gas such as Ar gas, gas pressure vessel 54 contains a gas for forming a-Si such as silicon hydride gas, for example, $SiH_4$, $Si_2H_6$, $Si_4H_{10}$ and mixture thereof, and gas pressure vessel 55 contains a gas for forming impurities to be introduced into the a-Si photoconductive layer, if desired, such as $PH_3$, $P_2H_4$, $B_2H_6$ and the like.

Flow rate controlling valves 59 and 60 are gradually opened while watching flow meters 56 and 57 and thus gases in pressure vessels 53 and 54 are fed to mixing tank 68 at a desired ratio in a desired amount to form a gas mixture, for example, a mixture of Ar and $SiH_4$. Then flow rate controlling valves 59 and 60 are closed and auxiliary valve 65 is gradually opened to introduce the gas mixture into deposition chamber 47 from mixing tank 68. In this case, a diluting gas such as Ar is not always necessary and it is allowed to introduce only a gas for forming a-Si such as $SiH_4$ and the like.

The ratio of a diluting gas to a gas for forming a-Si introduced into mixing tank 68 may be optionally selected as wanted. The ratio is usually more than 10 vol. % of a gas for forming a-Si based on a diluting gas. As the diluting gas, He gas may be used in place of Ar gas. Deposition chamber 47 is maintained at a desired pressure, for example $10^{-2}$–3 Torr. by controlling main valve 66. Then, to electrode of induction type 52 wound around deposition chamber 47 is applied a predetermined high frequency voltage, for example, 0.2–30 MHz, by high frequency power source 51 to cause glow discharge in deposition chamber 47 and decompose $SiH_4$ gas and Si is deposited on substrate 48 to form an a-Si layer.

If it is desired to introduce impurities into an a-Si photoconductive layer, the gas in pressure vessel 55 is introduced into mixing tank 68 together with the other gases. An amount of the gas for impurity-introducing can be controlled by flow rate controlling valve 61 so that the amount of impurities introduced into the a-Si photoconductive layer can be optionally controlled.

In a glow discharge apparatus of inductance type as in FIG. 5, the high frequency power for producing an a-Si layer having desired characteristics may be determined accordingly, but it is usually 0.1–300 W, preferably 0.1–150 W, more preferably 5–50 W. And characteristics of the resulting a-Si photoconductive layer is affected by the substrate temperature upon growing the a-Si layer and the growing speed of the layer to a great extent. Therefore, these factors should be strictly controlled. Desirable conditions of substrate temperature and growing speed of a-Si layer in a glow discharge apparatus of inductance type are similar to those mentioned concerning FIG. 3.

Figure 6:
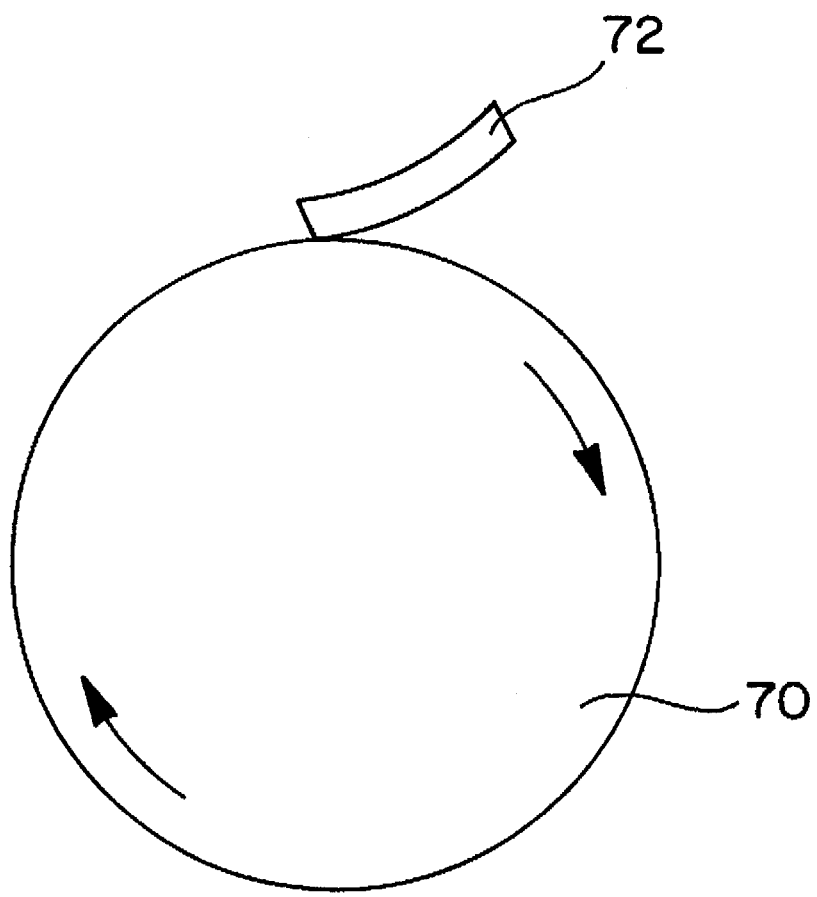
FIG. 6 is a schematic diagram of a cylindrical electrophotographic photosensitive member utilizing a cleaning blade.

In FIG. 6, a cylindrical photoconductive member 70 is provided with appropriate stations (not shown) around the member for sequentially charging the member, exposing the charged member to form a latent image, developing the latent image to form a toner image and transferring the toner image to an image receiving sheet. A rubber cleaning blade 72 is provided to remove residual toner from the surface of the photoconductive member 70.

The invention will be understood more readily by reference to the foil, owing examples; however, these examples are intended to illustrate the invention and are not to be construed to limit the scope of the invention.

EXAMPLE 1

In accordance with the procedure described below, an electrophotographic photosensitive member of the present invention was prepared by using an apparatus as shown in FIG. 3, and image forming treatment was applied to the photosensitive member.

An aluminum substrate was cleaned in such a manner that the surface of the substrate was treated with a 1% solution of NaOH and sufficiently washed with water and then dried. This substrate, which was 1 mm in thickness and 10 cm×5 cm in size, was firmly disposed at a fixed position in a fixing member 12 placed at a predetermined position in a deposition chamber 10 for glow discharge so that the substrate was kept apart from a heater 13 equipped to the fixing member 12 by about 1.0 cm.

The air in the deposition chamber 10 was evacuated by opening fully a main valve 29 to bring the chamber to a vacuum degree of about $5 \times 10^{-5}$ Torr. The heater 13 was then ignited to heat uniformly the aluminum substrate to 159° C., and the substrate was kept at this temperature a subsidiary valve 28 was fully opened, and subsequently a valve 25 of a bomb 16 to which Ar was charged and a valve 26 of a bomb 17 which was filled with $SiH_4$ were also opened fully, and thereafter, flow amount controlling valves 22, 23 were gradually opened so that Ar gas and $SiH_4$ gas were introduced into the deposition chamber 10 from the bombs 16, 17. At that time, the vacuum degree in the deposition chamber 10 was brought to and kept at about 0.075 Torr. by regulating the main valve 29.

A high frequency power source 14 was switched on to apply a high frequency voltage of 13.56 MHz between electrodes 15 and 15' so that a glow discharge was caused, thereby depositing and forming an a-Si type photoconductive layer on the aluminum substrate. At that time, the glow discharge was initiated with an electric current density of about 0.5 mA/cm² and a voltage of 500 V. Further, the growth rate of the a-Si layer was about 4 angstroms per second and the deposition was effected for 15 hours and further the thus formed a-Si layer had a thickness of 20 microns.

After completion of the deposition, while the main valve 29, valves 25 and 26, flow amount controlling valves 22 and 23, and subsidiary valve 28 were closed, a valve 30 was opened to break the vacuum state in the deposition chamber 10. The prepared photosensitive member was taken out from the apparatus.

To the a-Si type photoconductive layer surface of the photosensitive member was applied negative corona discharge with a power source voltage of 5500 V in a dark place. The image exposure was conducted in an exposure quantity of 15 lux·sec. to form an electrostatic image, which was then developed with a positively charged toner in accordance with the cascade method. The developed image was transferred to a transfer paper and then fixed so that an extremely sharp image with a high resolution was obtained.

The image forming process as mentioned above was repeatedly carried out in order to test the durability of the photosensitive member. As a result, the image on a transfer paper obtained when such process was repeated ten thousand (10,000) times was extremely good in the quality. Although such image was compared with the first image on a transfer paper obtained at the time of the initial operation of the image forming process, no different was observed therebetween. Therefore, it was found that the photosensitive member is excellent in the corona discharging resistance, abrasion resistance, cleaning property and the like and shows extremely excellent durability. In addition, the blade cleaning was effected in cleaning the photosensitive member after the transferring step, a blade formed of urethane rubber was used.

Further, the foregoing image forming process was repeated under the same condition except that positive corona discharge was applied with a voltage of 6,000 V to the photosensitive member and a negatively charged toner was used for the developing. The thus obtained image formed on a transfer paper had an image density lower than that of the image obtained in the foregoing image forming process using negative corona discharge. As a result, it was recognized that the photosensitive member prepared in this example depends upon the polarity to be charged.

EXAMPLE 2

In accordance with the procedure and condition used in Example 1, an a-Si type layer of 20 microns in thickness was formed on the aluminum substrate. The structure was taken out from the deposition chamber 10, and polycarbonate regin was then coated onto the a-Si type layer to form an electrically insulating layer having a thickness of 15 microns after drying.

To the insulating layer surface of the electrophotographic photosensitive member obtained in the above-mentioned manner was applied positive corona discharge with a power source voltage of 6,000 V as the primary charging for 0.2 sec. so that such surface was charged to a voltage of +2,000 V. Next, negative corona discharging with a voltage of 5,500 V was carried out as the secondary charging simultaneously with image exposure in an exposure quantity of 15 lux·sec., and the whole surface of the photosensitive member was then exposed uniformly to form an electrostatic image. This image was developed with a negatively charged toner by the cascade method, and the thus developed image was transferred to a transfer paper and fixed so that an image of extremely excellent quality was obtained.

EXAMPLE 3

In the following manner similar to that in Example 1, an electrophotographic photosensitive member was prepared by using the apparatus as illustrated in FIG. 3 and the image forming treatment was applied to the photosensitive member.

An aluminum substrate having a thickness of 1 mm and a size of 10 cm×10 cm was first treated with a 1% solution of NaOH and sufficiently washed with water and dried to clean the surface of the substrate. This substrate was firmly disposed at a fixed position in a fixing member 12 placed at a predetermined position in a deposition chamber 10 for glow discharge so that it might be kept apart from a heater 13 positioned in the fixing member 12 by about 1.0 cm.

A main valve 29 was fully opened to evacuate the air in the deposition chamber 10 so that the vacuum degree in the chamber was adjusted to about $5\times10^{-5}$ Torr. The heater 13 was then ignited to heat uniformly the aluminum substrate to 150° C., the substrate being kept at that temperature. Then, a subsidiary valve 28 was first opened fully, and successively a valve 25 of a bomb 16 containing Ar charged thereto and a valve 26 of a bomb 17 containing $SiH_4$ charged thereto were fully opened. Thereafter, the flow amount controlling valves 22 and 23 were gradually opened so that Ar gas and $SiH_4$ gas were introduced into the deposition chamber 10 from the bombs 16 and 17, respectively. At this time, the vacuum degree in the deposition chamber 10 was kept at about 0.075 Torr. by regulating the main valve 29, and while flow meters 19 and 20 were carefully observed, the flow amount controlling valves 22 and 23 were regulated to control the flow amount of the gases so that the flow amount of the $SiH_4$ gas might be 10% by volume based on that of the Ar gas.

A valve 27 of a bomb 18 containing $B_2H_6$ charged thereto was fully opened and a flow amount controlling valve 24 was slowly opened to introduce $B_2H_6$ gas into the deposition chamber 10 while the flow amount of the gas was controlled so that it might be $5\times10^{-3}\%$ by volume based on the flow amount of the $SiH_4$ gas. In this case, the main valve 29 was regulated to retain the vacuum degree in the deposition chamber 10 to 0.075 Torr.

Subsequently, a high frequency power source 14 was switched on in order to apply a high frequency voltage of 13.56 MHz between electrodes 15 and 15' to give rise to the glow discharge so that an a-Si type photoconductive layer is formed on the aluminum substrate by the deposition. At the time of the glow discharge, the current density was about 3 $mA/cm^2$ and the voltage 500 V. Further, the growth rate of the a-Si type layer was about 4 angstroms/sec., the period of time for the deposition 15 hours, and the thickness of the a-Si type layer 20 microns. After completion of the deposition, the main valve 29, subsidiary valve 28, flow amount controlling valves 22, 23, 24, and valves 25, 26, 27 were closed, but the valve 30 was opened to break the vacuum state in the deposition chamber 10. Then, the electrophotographic photosensitive member obtained in the above mentioned manner was taken out from the apparatus.

To the a-Si type photoconductive layer surface of the photosensitive member was applied negative corona discharge with a voltage of 5,500 V in a dark place. The image exposure was conducted in an exposure quantity of 20 lux·sec. to form an electrostatic image, which was then developed with a positively charged toner in accordance with the cascade method. The developed image was transferred to a transfer paper and then fixed so that an excellent sharp image was obtained.

The image forming process as mentioned above was repeatedly carried out in order to test the durability of the photosensitive member. As a result, the image on a transfer paper obtained when such process was repeated ten thousand (10,000) times was extremely good in the quality. Although such image was compared with the first image on a transfer paper obtained at the time of the initial operation of the image forming process, no different was observed therebetween. Therefore, it was found that the photosensitive member is excellent in the durability. In addition, the blade cleaning was effected in cleaning the photosensitive member after the transferring step, the blade bieng formed of urethane rubber.

Further, positive corona discharge with a power source voltage of 6,000 V was applied to the photosensitive member in a dark place and the image exposure was conducted in an exposure amount of 20 lux·sec. to form an electrostatic image. This electrostatic image was developed with a negatively charged toner by the cascade method. The developed image was then transferred to a transfer paper and fixed so that an image with extreme sharpness war obtained.

It was found from this result and the before-mentioned result that the photosensitive member obtained in this example does not have dependability to the charged polarity, but possesses properties of a photosensitive member which produces advantageously good image when either polarity is charged.

EXAMPLE 4

The same procedure as in Example 3 was repeated except that the flow amount of the $B_2H_6$ gas was adjusted to $5 \times 10^{-4}\%$ by volume based on the flow amount of the $SiH_4$ gas, to prepare an electrophotographic photosensitive member having an a-Si type photoconductive layer of 20 microns in thickness on the aluminum substrate.

In accordance with the same condition and manner as in Example 3, the image forming process was carried out by using the obtained photosensitive member to form an image on a transfer paper. As a result, the image formed by the process using positive corona discharge was excellent in quality and very sharp as compared with that obtained by the process employing negative corona discharge.

It is recognized from the result that the photosensitive member of this example depends upon the polarity to be charged. In addition, this polarity dependability is contrary to that of the photosensitive member obtained in Example 1.

EXAMPLE 5

In accordance with the procedure and condition used in Example 4, an a-Si type layer of 20 microns in thickness was formed on the aluminum substrate. The structure was then taken out from the deposition chamber 10 to the outside, and polycarbonate resin was then coated onto the a-Si type layer to form an electrically insulating layer having a thickness of 15 microns after drying.

To the insulating layer surface of the electrophotographic photosensitive member obtained in the above-mentioned manner was applied negative corona discharge with a power source voltage of 6,000 V as the primary charging for 0.2 sec. so that such surface was charged to a voltage of −2,000 V. Positive corona discharging with a voltage of 5,500 V was carried out as the secondary charging simultaneously with the image exposure in an exposure quantity of 15 lux·sec., and the whole surface of the photosensitive member was then exposed uniformly to form an electrostatic image. This image was developed with a positively charged toner by the cascade method, and the thus developed image was transferred to a transfer paper and fixed so that an image of extremely excellent quality was obtained.

EXAMPLE 6

Photosensitive members were prepared by repeating the same procedure under the same condition as in Example 1 except that the temperature of the substrate was varied as shown in Table 1 given below. The prepared photosensitive members are indicated by Sample Nos. 1–8 in Table 1.

By using the photosensitive members, the image formation was carried out under the same condition as in Example 3 to form images on transfer papers. The obtained results are as shown in Table 1.

As understood from the results, it is necessary to form the a-Si layer at a temperature of the substrate ranging from 50° C. to 350° C. for the purpose of achieving the object of the present invention.

TABLE 1

| | Sample No. | | | | | | | |
|---|---|---|---|---|---|---|---|---|
| | 1 | 2 | 3 | 4 | 5 | 6 | 7 | 8 |
| | Substrate temp., °C. | | | | | | | |
| | 50 | 100 | 150 | 200 | 250 | 300 | 350 | 400 |
| Image quality | | | | | | | | |
| Charged ⊕ polarity ⊖ | X<br>Δ | Δ<br>◉ | Δ<br>◉ | Δ<br>◉ | X<br>o | X<br>o | X<br>Δ | X<br>X |

Image quality is that of transferred image.
◉ Very good; o Good; Δ Acceptable for practical use; X Poor

EXAMPLE 7

Photosensitive members were prepared by repeating the same procedure and condition as in Example 3 except that the temperature of the substrate was varied as shown in Table 2 given below. The prepared photosensitive members are indicated by Sample Nos. 9–16 in Table 2.

By using the photosensitive members, the image formation was carried out by using the same procedure and condition as in Example 3 to form images on transfer papers. The obtained results are as shown in Table 2.

As understood from the results, it is necessary to form the a-Si layer at a temperature of the substrate ranging from 50° C. to 350° C. for the purpose of achieving the object of the present invention.

TABLE 2

| | Sample No. | | | | | | | |
|---|---|---|---|---|---|---|---|---|
| | 9 | 10 | 11 | 12 | 13 | 14 | 15 | 16 |
| | Substrate temp., °C. | | | | | | | |
| | 50 | 100 | 150 | 200 | 250 | 300 | 350 | 400 |
| Image quality | | | | | | | | |
| Charged ⊕ polarity ⊖ | Δ<br>Δ | ◉<br>◉ | ◉<br>◉ | ◉<br>◉ | o<br>o | o<br>o | Δ<br>Δ | X<br>X |

Image quality is that of transferred image.
◉ Very good; o Good; Δ Acceptable for practical use; X Poor

EXAMPLE 8

Photosensitive members were prepared by repeating the same procedure and condition as in Example 4 except that the temperature of the substrate was varied as shown in Table 3 given below. The prepared photosensitive members are indicated by Sample Nos. 17–24 in Table 3.

By using the photosensitive members, the image formation was carried out by employing the same procedure and condition as in Example 4 to form images on transfer papers. The obtained results are as shown in Table 3.

As understood from the results, it is necessary to form the a-Si type layer at a temperature of the substrate ranging from 50° C. to 350° C. for the purpose of achieving the object of the present invention.

TABLE 3

| | Sample No. | | | | | | | |
|---|---|---|---|---|---|---|---|---|
| | 17 | 18 | 19 | 20 | 21 | 22 | 23 | 24 |
| | Substrate temp., °C. | | | | | | | |
| | 50 | 100 | 150 | 200 | 250 | 300 | 350 | 400 |
| Image quality | | | | | | | | |
| Charged polarity ⊕ | Δ | ◎ | ◎ | ◎ | o | o | Δ | X |
| Charged polarity ⊖ | X | Δ | Δ | Δ | X | X | X | X |

Image quality is that of transferred image.
◎ Very good; o Good; Δ Acceptable for practical use; X Poor

EXAMPLE 9

A cylinder made of aluminum having a thickness of 2 mm and a size of 1500 mm×300 mm was disposed in a deposition apparatus for glow discharge shown in FIG. 3 so that it might rotate freely, and a heater was mounted so as to heat the cylinder from the inside of the cylinder.

The air in a deposition chamber 10 was evacuated by opening fully a main valve 29 to bring the chamber to a vacuum degree of about $5 \times 10^{-5}$ Torr. The heater 13 was ignited to heat uniformly the cylinder to 150° C. simultaneously with the cylinder being rotated at a speed of three revolutions per minute, and the cylinder was kept at that temperature. A subsidiary valve 28 was fully opened, and subsequently a valve 25 of a bomb 16 to which Ar was charged and a valve 26 of a bomb 17 which was filled with $SiH_4$ were also opened fully, and thereafter, flow amount controlling valves 22, 23 were gradually opened so that Ar gas and $SiH_4$ gas were introduced into the deposition chamber 10 from the bombs 16, 17. At that time, the vacuum degree in the deposition chamber 10 was brought to and kept at about 0.075 Torr. by regulating the main valve 29. Further, the flow amount of the $SiH_4$ gas was adjusted to 10% by volume based on that of the Ar gas.

After fully opening of a valve 27 of a bomb 18, to which $B_2H_6$ was charged, a flow amount controlling valve 24 was gradually opened while a flow meter 21 was carefully observed, to adjust the flow amount of $B_2H_6$ gas to $10^{-5}$% by volume based on that of the $SiH_4$ gas, thereby introducing the $B_2H_6$ gas into the deposition chamber 10. Also at that time, the main valve 29 was regulated to bring the vacuum degree in the deposition chamber 10 to about 0.075 Torr.

A high frequency power source 14 was switched on to apply a high frequency voltage of 13.56 MHz between electrodes 15 and 15' so that a glow discharge was caused, thereby depositing and forming an a-Si type photoconductive layer on the cylinder substrate. At that time, the glow discharge was initiated with an electric current density of about 3 mA/cm² and a voltage of 1,500 V. Further, the growth rate of the a-Si type layer was about 2.5 angstroms per second and the deposition was effected for 23 hours and further the thus formed a-Si type layer had a thickness of 20 microns.

After completion of the deposition, while the main valve 29, subsidiary valve 28, flow amount controlling valves 22 and 23, valves 25 and 26 were closed, a valve 30 was opened to break the vacuum state in the deposition chamber 10. The prepared electrophotographic photosensitive member was taken out from the deposition apparatus.

To the a-Si type photoconductive layer surface of the photosensitive member was applied negative corona discharge with a power source voltage of 5,500 V in a dark place. The image exposure was conducted in an exposure quantity of 20 lux·sec. to form an electrostatic image, which was then developed with a positively charged toner in accordance with the cascade method. The developed image was transferred to a transfer paper and then fixed so that an extremely sharp image was obtained.

The image forming process as mentioned above was repeatedly carried out in order to test the durability of the photosensitive member. As a result, the image on the transfer paper obtained when such process was repeated ten thousand (10,000) times was extremely good in the quality. Although such image was compared with the first image on a transfer paper obtained at the time of the initial operation of the image forming process, no different was observed therebetween. Therefore, it was found that the photosensitive member is extremely excellent in the durability. In addition, the blade cleaning was effected in cleaning the photosensitive member after the transferring step, the blade being formed of urethane rubber.

Further, the foregoing image forming process was repeated under the same condition except that positive corona discharge was applied with a power source voltage of 6,000 V to the photosensitive member and a negatively charged toner was used for the development. The thus obtained image formed on the transfer paper had an image density lower than that of the image obtained in the foregoing image forming process using negative corona discharge. As a result, it was recognized that the photosensitive member prepared in this example depends upon the polarity to be charged.

EXAMPLE 10

Electrophotographic photosensitive members, which are indicated by Sample Nos. 25–29 in Table 4 given below, were prepared by conducting the same procedure under the same condition as in Example 3 except that the flow amount of the $B_2H_6$ gas based on that of the $SiH_4$ gas was varied in order to control the amount of the boron (B) doped into the a-Si type layer to various values as shown in Table 4.

The image formation was effected by employing the photosensitive members under the same condition as in Example 3 to obtain images on transfer papers. The results are shown in Table 4. As clear from the results, with respect to practically usable photosensitive member, it is desired to dope the a-Si type layer with boron (B) in an amount of $10^{-6}$–$10^{-3}$ atomic percent.

TABLE 4

| | Sample No. | | | | |
|---|---|---|---|---|---|
| | 25 | 26 | 27 | 28 | 29 |
| Doping amount of B, atomic % | $10^{-6}$ | $10^{-5}$ | $10^{-4}$ | $10^{-3}$ | 1 |
| Image quality | o | ◎ | ◎ | o | X |

Image quality is that of transferred image.
◎ Very good; o Good; X Poor

EXAMPLE 11

In accordance with the procedure described below, an electrophotographic photosensitive member was prepared by using an apparatus as shown in FIG. 4, and the image forming treatment was applied to the photosensitive member.

An aluminum substrate of 1 mm in thickness and 10 cm×10 cm in size was cleaned in such a manner that the surface of the substrate was treated with a 1% solution of NaOH and sufficiently washed with water and dried, and then Mo was deposited to this substrate to about 1,000 angstroms in thickness. This substrate was firmly fixed at a predetermined position in a fixing member 33 placed in a deposition chamber 31 so that the substrate was kept apart from a heater 34 by about 1.0 cm. Also, the substrate was parted from a target 35 of polycrystalline silicon having a purity of 99.999% by about 8.5 cm.

The air in the deposition chamber 31 was evacuated to bring the chamber to a vacuum degree of about $1\times10^{-6}$ Torr. The heater 34 was ignited to heat uniformly the substrate to 150° C., and the substrate was kept at this temperature. A valve 45 was fully opened, and subsequently a valve 40 of a bomb 38 was also opened fully, and thereafter, a flow amount controlling valve 44 was gradually opened so that $H_2$ gas was introduced into the deposition chamber 31 from the bomb 38. At that time, the vacuum degree in the deposition chamber 31 was brought to and kept at about $5.5\times10^{-4}$ Torr. by regulating the main valve 46.

Subsequently, after fully opening of a valve 39, a flow amount controlling valve 43 was gradually opened with a flow meter 41 being carefully observed, to introduce Ar gas into the deposition chamber 31 in which the vacuum degree was adjusted to $5\times10^{-3}$ Torr.

A high frequency power source 36 was switched on to apply a high frequency voltage of 13.56 MHz, 1 KV between the aluminum substrate and polycrystalline silicon target so that a discharge was caused, thereby starting formation of an a-Si layer on the aluminum substrate. This operation was conducted continuously with a growth rate of the a-Si layer being controlled to about two angstroms per second for 30 hours. The thus formed a-Si layer was 20 microns in thickness.

To the thus prepared electrophotographic photosensitive member was applied negative corona discharge with a power source voltage of 5,500 V in a dark place. The image exposure was conducted in an exposure quantity of 15 lux·sec. to form an electrostatic image, which was then developed with a positively charged toner in accordance with the cascade method. The developed image was transferred to a transfer paper and then fixed so that an extremely sharp image was obtained.

EXAMPLE 12

Electrophotographic photosensitive members, which are indicated by Sample Nos. 30–36 in Table 5 given below, were prepared by conducting the same procedure under the same condition as in Example 11 except that the flow amount of the $H_2$ gas based on that of the Ar gas was varied in order to control the amount of the hydrogen (H) doped into the a-Si type layer to various values as shown in Table 5.

The image formation was effected by employing the photosensitive members under the same condition as in Example 11 to obtain images on transfer papers. The results are shown in Table 5. As clear from the results, with respect to practically usable photosensitive member, it is desired to dope the a-Si type layer with H in an amount of 10–40 atomic percent.

TABLE 5

| | Sample No. | | | | | | |
|---|---|---|---|---|---|---|---|
| | 30 | 31 | 32 | 33 | 34 | 35 | 36 |
| Doping amount of H, atomic % | 5 | 10 | 15 | 25 | 30 | 40 | 50 |
| Image quality | X | o | ⊙ | ⊙ | ⊙ | o | X |

Image quality is that of transferred image.
⊙ Very good; o Good; X Poor

EXAMPLE 13

The electrophotographic photosensitive members prepared in Examples 1, 3 and 4 were each allowed to stand in an atmosphere of high temperature and humidity, i.e., at a temperature of 40° C. and relative humidity of 90 RH %. After the lapse of 96 hours, the photosensitive members were taken out into an atmosphere at a temperature of 23° C. and relative humidity of 50 RH %. Immediately thereafter, the same image forming processes as in Examples 1, 3 and 4 were conducted under the same condition by using the photosensitive members to obtain images of sharpness and good quality on transfer paper. This result showed that the photosensitive member of the present invention is very excellent also in moisture resistance.

EXAMPLE 14

An electrophotographic photosensitive member was prepared in the same manner as that in Example 1. To the member was applied negative corona discharge at a voltage of 6,000 V in a dark place and image exposure was then conducted in an exposure quantity of 20 lux·sec. to form an electrostatic image, which was then developed with a liquid developer containing a chargeable toner dispersed in a solvent of an isoparaffin type hydrocarbon. The developed image was transferred to a transfer paper followed by fixing. The fixed image was extremely high in the resolution and of good image quality with sharpness.

Further, the above described image forming process was repeated in order to test the solvent resistance, in other words, liquid developer resistance of the photosensitive member. The above-mentioned image on the transfer paper was compared with an image on a transfer paper obtained when the image forming process was repeated ten thousand (10,000) times. As a result, no difference was found therebetween, which showed that the photosensitive member of the present invention is excellent in the solvent resistance.

In addition, as the manner of cleaning the photosensitive member surface effected in the image forming process, the blade cleaning method was used, the blade being formed of urethane rubber.

EXAMPLE 15

In accordance with the procedure described below, an electrophotographic photosensitive member was prepared by using a depositing apparatus for glow discharge as illustrated in FIG. 5 and the image forming process was carried out by employing the photosensitive member.

An aluminum substrate 48 having a size of 10 cm×10 cm×1 mm already cleaned by the same surface treatment as in Example 1 was firmly disposed at a fixed position in a fixing member 49 placed in a deposition chamber 47 so that the substrate might be kept apart from a heater 50 by 1.0 cm or so.

A main valve 66 and subsidiary valve 65 were fully opened to evacuate the air in the deposition chamber 47 and mixing tank 68, thereby bring them to the vacuum degree of about $5\times10^{-5}$ Torr. The heater 50 was then ignited to heat uniformly the aluminum substrate to 150° C., the substrate being kept at that temperature.

The subsidiary valve 65 was then closed, while a valve 62 of a bomb 53 which was filled up with Ar and valve 63 of a bomb 54 containing $SiH_4$ charged thereto were fully opened. Flow amount controlling valves 59, 60 for the gas bombs 53, 54 were regulated with flow meters 56, 57 being-observed so that Ar gas and $SiH_4$ gas were fed to the mixing tank 68 at a ratio by volume of $Ar:SiH_4=10:1$. While the flow amount controlling valves 59, 60 were then closed, the subsidiary valve 65 was gradually opened to introduce a gas mixture of Ar and $SiH_4$ gases into the deposition chamber 47. At that time, the main valve 66 was regulated to retain the vacuum degree in the deposition chamber 47 at about 0.075 Torr.

Subsequently, a high frequency power source 51 was switched on to apply a high frequency voltage of 13.56 MHz to inductance type coil 52. As a result, a glow discharge took place, thereby forming an a-Si type photoconductive layer on the aluminum substrate by deposition. At that time, the high frequency power was about 50 W and the growth rate of the layer about three angstroms per second. Further, the period of time for the deposition was 20 hours and the formed a-Si type layer had a thickness of about 20 microns.

To the a-Si type photoconductive layer surface of the thus prepared photosensitive member was applied negative corona discharge with a source voltage of 5,500 V in a dark place. The image exposure was then effected in an exposure quantity of 15 lux·sec. to form an electrostatic image, which was then developed with a positively charged toner by the cascade method. The developed image was transferred to a transfer paper and fixed. As a result, an image of high resolution with very sharpness was obtained.

EXAMPLE 16

In accordance with the procedure described below, an electrophotographic photosensitive member was prepared by using an apparatus as illustrated in FIG. 5 and the image forming process was carried out by employing the photosensitive member.

An aluminum substrate having a thickness of 1 mm and size of 10 cm×10 cm already was cleaned in such a manner that the surface was treated with a 1% solution of NaOH, sufficiently washed with water and dried. This substrate was firmly disposed at a predetermined position in a fixing member 49 placed in a deposition chamber 47 so that the substrate might be kept apart from a heater 50 by 1.0 cm or so.

A main valve 66 and subsidiary valve 65 were fully opened to evacuate the air in the deposition chamber 47 and mixing tank 68, thereby bring them to the vacuum degree of about $5\times10^{-5}$ Torr. The heater 50 was then ignited to heat uniformly the aluminum substrate to 150° C., the substrate being kept at that temperature.

The subsidiary valve 65 was them closed, while a valve 62 of a bomb 53 and valve 63 of a bomb 54 were fully opened. Flow amount controlling valves 59, 60 were gradually opened with flow meters 56, 57 being observed so that Ar gas and $SiH_4$ gas were introduced from the bombs 53, 54, respectively, to the mixing tank 68 at a ratio by volume of $Ar:SiH_4=10:1$. After a predetermined amount of the Ar and $SiH_4$ gases were fed to the tank 68, the flow amount controlling valves 59, 60 were then closed.

Next, a valve 64 of a bomb 55 was fully opened, and thereafter a flow amount controlling valve 61 was gradually opened to introduce $B_2H_6$ gas into the mixing tank 68 from the bomb 55 while the flow amount of the $B_2H_6$ gas was controlled to a ratio by volume of $SiH_4:B_2H_6=1:3\times10^{-5}$. After a predetermined amount of the $B_2H_6$ gas was fed to the tank 68, the valve 61 was closed. Then, the subsidiary valve 65 was gradually opened to introduce a gas mixture of Ar, $SiH_4$ and $B_2H_6$ gases from the tank 68 into the deposition chamber 47. At this time, the main valve 66 was regulated to bring the vacuum degree in the deposition chamber 47 to 0.075 Torr.

Subsequently, a high frequency power source 51 was switched on to apply a high frequency voltage of 13.56 MHz to inductance type coil 52. As a result, a glow discharge took place, thereby forming an a-Si type photoconductive layer on the aluminum substrate by deposition. At that time, the high frequency power was about 50 W and the growth rate of the layer about 4 angstroms per second. Further, the period of time for the deposition was 15 hours and the formed a-Si type layer had a thickness of about 20 microns.

After completion of the deposition, the main valve 66 and subsidiary valve 65 were closed, but the valve 67 was opened to break the vacuum state in the deposition chamber 47. The prepared photosensitive member was taken out from the apparatus.

To the a-Si type photoconductive layer surface of the thus prepared photosensitive member was applied negative corona discharge with a source voltage of 5,500 V in a dark place. The image exposure was then effected in an exposure quantity of 20 lux·sec. to form an electrostatic image, which was then developed with a positively charged toner by the cascade method. The developed image was transferred to a transfer paper and fixed. As a result, an image with very sharpness was obtained.

The image forming process as mentioned above was repeatedly carried out in order to test the durability of the photosensitive member. As a result, the image on the transfer paper obtained when such process was repeated ten thousand (10,000) times was extremely good in the quality. Although such image was compared with the first image on a transfer paper obtained at the time of the initial operation of the image forming process, no different was observed therebetween. Therefore, it was found that the photosensitive member is very excellent in the durability. In addition, the blade cleaning was effected in cleaning the photosensitive member after the transferring step and the blade was formed of urethane rubber.

EXAMPLE 17

An electrophotographic photosensitive member was prepared by using the same procedure and condition as in Example 11 except that in place of the $H_2$, $SiH_4$ was charged to the bomb 38 and $SiH_4$ gas was introduced into the deposition chamber 31.

The image formation was effected by using the photosensitive member in the same manner as in Example 11 under the equivalent condition. The obtained result was similar to that in Example 11.

EXAMPLE 18

In accordance with the procedure described below, an electrophotographic photosensitive member was prepared by using an apparatus as shown in FIG. 3, and the image forming treatment was applied to the photosensitive member.

An aluminum substrate of 1 mm in thickness and 10 cm×5 cm in size was cleaned in such a manner that the surface of the substrate was treated with a 1% solution of NaOH and sufficiently washed with water and then dried. This substrate was firmly fixed at a predetermined position in a fixing member 12 placed in a deposition chamber 10 for glow discharge so that the substrate was kept apart from a heater 13 equipped to the fixing member 12 by about 1.0 cm.

The air in the deposition chamber 10 was evacuated by opening fully a main valve 29 to bring the chamber to a vacuum degree of about $5 \times 10^{-5}$ Torr. A subsidiary valve 28 was fully opened, and subsequently a valve 25 of a bomb 16 was also opened fully, and thereafter, a flow amount controlling valve 22 was gradually opened so that Ar gas was introduced into the deposition chamber 10 from the bomb 16. At that time, the inside pressure in the deposition chamber 10 was brought to and kept at abut 0.075 Torr.

A high frequency power source 14 was switched on to apply a high frequency voltage of 13.56 MHz between electrodes 15 and 15' so that a glow discharge was caused, thereby cleaning the surface of the aluminum substrate. At that time, the glow discharge was initiated with a current density of about 0.5 mA/cm$^2$ and a voltage of 500 V. After completion of the cleaning treatment, the subsidiary valve 28, valve 25 and flow amount controlling valve 22 were closed.

Subsequently, in accordance with the procedure and condition used in Example 1, an a-Si layer of about 20 microns in thickness was formed on the aluminum substrate to obtain an electrophotographic photosensitive member.

The photosensitive member was used to the image forming process in the same manner and condition as in Example 1 to obtain an image transferred to a paper. Similar result to that in Example 1 was obtained. Further, as to the durability of the photosensitive member, the same result was obtained.

EXAMPLE 19

An electrophotographic photosensitive member having an a-Si was prepared by employing the same procedure and condition as in Example 1. Deposition of Ta$_2$O$_5$ to the surface of the photoconductive layer was effected by the electron beam deposition to form an anti-reflection layer of 70 milli microns in thickness.

The image forming process described in Example 1 was repeated by using the thus prepared photosensitive member. As a result, it was found that the photosensitive member requires an exposure quantity of only about 12 lux·sec. to attain a transferred image density similar to that obtained in Example 1.

EXAMPLE 20

In accordance with the procedure described below, an electrophotographic photosensitive member was prepared by using an apparatus as shown in FIG. 3, and the image forming treatment was applied to the photosensitive member.

An aluminum substrate of 1 mm in thickness and 10 cm×10 cm in size was cleaned in such a manner that the surface of the substrate was treated with a 1% solution of NaOH and sufficiently washed with water and then dried. This substrate was firmly fixed at a predetermined position in a fixing member 12 placed in a deposition chamber 10 for glow discharge so that the substrate was kept apart from a heater 13 by about 1.0 cm.

The air in the deposition chamber 10 was evacuated by opening fully a main valve 29 to bring the chamber to a vacuum degree of about $5 \times 10^{-5}$ Torr. The heater 13 was ignited to heat uniformly the aluminum substrate to 150° C., and the substrate was kept at this temperature. A subsidiary valve 28 was fully opened, and subsequently a valve 25 of a bomb 16 and a valve 26 of a bomb 17 were also opened fully, and thereafter, flow amount controlling valves 22, 23 were gradually opened so that Ar gas and SiH$_4$ gas were introduced into the deposition chamber 10 from the bombs 16 and 17, respectively. At that time, the vacuum degree in the deposition chamber 10 was brought to and kept at about 0.075 Torr by regulating the main valve 29.

A high frequency power source 14 was switched on to apply a high frequency voltage of 13.56 MHz between electrodes 15 and 15' so that a glow discharge was caused, thereby depositing and forming an a-Si type photoconductive layer on the aluminum substrate. At that time, the glow discharge was initiated with an electric current density of about 5 mA/cm$^2$ and a voltage of 2,000 V. Further, the growth rate of the a-Si type layer was about 4 angstroms per second and the deposition was effected for 15 hours and further the thus formed a-Si type layer had a thickness of 20 microns.

After completion of the deposition, while the main valve 29, valves 25 and 26, flow amount controlling valves 22 and 23, and subsidiary valve 28 were closed, a valve 30 was opened to break the vacuum state in the deposition chamber 10. The prepared photosensitive member was then taken out from the deposition chamber.

To the a-Si type photoconductive layer surface of the photosensitive member was applied negative corona discharge with a source voltage of 5,500 V in a dark place. The image exposure was conducted in an exposure quantity of 15 lux·sec. to form an electrostatic image, which was then developed with a positively charged toner in accordance with the cascase method. The developed image was transferred to a transfer paper and then fixed so that a sharp image with a high resolution was obtained.

The image forming-process as mentioned above was repeatedly carried out in order to test the durability of the photosensitive member. As a result, the image on the transfer paper obtained when such process was repeated ten thousand (10,000) times was extremely good in the quality. Although such image was compared with the first image on a transfer paper obtained at the time of the initial operation of the image forming process, no different was observed therebetween. Therefore, it was found that the photosensitive member is excellent in the corona discharging resistance, abrasion resistance, cleaning property and the like and shows extremely excellent durability. In addition, the blade cleaning was effected in cleaning the photosensitive member after the transferring step, the blade being formed of urethane rubber.

Further, the foregoing image forming process was repeated under the same condition except that positive corona discharge was applied with a voltage of 6,000 V to the photosensitive member and negatively charged toner was used for the development. The thus obtained image formed on the transfer paper had an image density lower than that of the image obtained in the foregoing image forming process using negative corona discharge.

As a result, it was recognized that the photosensitive member prepared in this example depends upon the polarity to be charged.

EXAMPLE 21

In accordance with the procedure and condition used in Example 20, an a-Si type layer of 20 microns in thickness was formed on the aluminum substrate. The structure was taken out from the deposition chamber 10 to the outside, and polycarbonate resin was then coated onto the a-Si type layer to form an electrically insulating layer having a thickness of 15 microns after drying.

To the insulating layer surface of the electrophotographic photosensitive member obtained in the above-mentioned manner was applied positive corona discharge with a power source voltage of 6,000 V as the primary charging for 0.2 sec. so that such surface was charged to a voltage of +2,000 V. Negative corona discharging with a voltage of 5,500 V was carried out as the secondary charging simultaneously with the image exposure in an exposure quantity of 15 lux·sec., and the whole surface of the photosensitive member was then exposed uniformly to form an electrostatic image. This image was developed with a negatively charged toner by the cascade method, and the thus developed image was transferred to a transfer paper and fixed so that an image of extremely excellent quality was obtained.

EXAMPLE 22

In the following manner similar to that in Example 20, an electrophotographic photosensitive member was prepared by using the apparatus as illustrated in FIG. 3 and the image forming treatment was applied to the photosensitive member.

An aluminum substrate having a thickness of 1 mm and a size of 10 cm×10 cm was first treated with a 1% solution of NaOH and sufficiently washed with water and dried to clean the surface of the substrate. This substrate was firmly disposed at a fixed position in a fixing member 12 placed in a deposition chamber 10 for glow discharge so that it might be kept apart from a heater 13 positioned in the fixing member 12 by about 1.0 cm.

A main valve 29 was fully opened to evacuate the air in the deposition chamber 10 so that the vacuum degree in the chamber was adjusted to about $5 \times 10^{-5}$ Torr. The heater 13 was ignited to heat uniformly the aluminum substrate to 150° C., the substrate being kept at that temperature. Then, a subsidiary valve 28 was first opened fully, and successively a valve 25 of a bomb 16 containing Ar charged thereto and a valve 26 of a bomb 17 containing $SiH_4$ charged thereto were fully opened. Thereafter, the flow amount controlling valves 22 and 23 were gradually opened so that Ar gas and $SiH_4$ gas were introduced into the deposition chamber 10 from the bombs 16 and 17, respectively. At this time, the vacuum degree in the deposition chamber 10 was kept at about 0.075 Torr. by regulating the main valve 29, and while flow meters 19 and 20 were carefully observed, the flow amount controlling valves 22 and 23 were regulated to control the flow amount of the gases so that the flow amount of the $SiH_4$ gas might be 10% by volume based on that of the Ar gas.

A valve 27 of a bomb 18 containing $B_2H_6$ charged thereto was fully opened and then a flow amount controlling valve 24 was slowly opened to introduce $B_2H_6$ gas into the deposition chamber 10 while the flow amount of the gas was controlled so that it might be $5 \times 10^{-3}$% by volume based on the flow amount of the $SiH_4$ gas. In this case, the main valve 29 was regulated to retain the vacuum degree in the deposition chamber 10 to 0.075 Torr.

Subsequently, a high frequency power source 14 was switched on in order to apply a high frequency voltage of 13.56 MHz between electrodes 15 and 15' to give rise to the glow discharge so that an a-Si type photoconductive layer is formed on the aluminum substrate by the deposition. At the time of the glow discharge, the current density was about 3 $mA/cm^2$ and the voltage 1,500 V. Further, the growth rate of the a-Si type layer was about 4 angstroms/sec., the period of time for the deposition 15 hours, and the thickness of the a-Si type layer 20 microns. After completion of the deposition, the main valve 29, subsidiary valve 28, flow amount controlling valves 22, 23, 24, and valves 25, 26, 27 were closed, but the valve 30 was opened to break the vacuum state in the deposition chamber 10. Then, the electrophotographic photosensitive member obtained in the above mentioned manner was taken out from the apparatus.

To the a-Si type photoconductive layer surface of the photosensitive member was applied negative corona discharge with a voltage of 5,500 V in a dark place. The image exposure was conducted in an exposure quantity of 20 lux·sec. to form an electrostatic image, which was then developed with a positively charged toner in accordance with the cascade method. The developed image was transferred to a transfer paper and then fixed so that an extremely sharp image was obtained.

The image forming process as mentioned above was repeatedly carried out in order to test the durability of the photosensitive member. As a result, the image on the transfer paper obtained when such process was repeated ten thousand (10,000) times was extremely-good in the quality. Although such image was compared with the first image on a transfer paper obtained at the time of the initial operation of the image forming process, no different was observed therebetween. Therefore, it was found that the photosensitive member is very excellent in the durability., In addition, the blade cleaning was effected in cleaning the photosensitive member after the transferring step, the blade being formed of urethane rubber.

Further, positive corona discharge with a power source voltage of 6,000 V was applied to the photosensitive member in a dark place and the image exposure was conducted in an exposure quantity of 20 lux·sec. to form an electrostatic image. This electrostatic image was developed with a negatively charged toner by the cascade method. The developed image was then transferred to a transfer paper and fixed so that an image with extreme sharpness was obtained.

It was found from this result and the before-said result that the photosensitive member obtained in this example does not have dependability to the charged polarity, but it possesses properties of a photosensitive member which can be advantageously used with both polarities to be charged.

EXAMPLE 23

The same procedure as in Example 22 was repeated except that the flow amount of the $B_2H_6$ gas was adjusted to $5 \times 10^{-4}$% by volume based on the flow amount of the $SiH_4$ gas, to prepare an electrophotographic photosensitive member having an a-Si type photoconductive layer of 20 microns in thickness on the aluminum substrate.

In accordance with the same condition and manner as in Example 3, the image forming process was carried out by using the obtained photosensitive member to form an image on a transfer paper As a result, the image formed by the process using positive corona discharge was excellent in quality and very sharp as compared with that obtained by the process employing negative corona discharge.

It is recognized from the result that the photosensitive member of this example depends upon the polarity to be charged. In addition, this polarity dependability is contrary to that of the photosensitive member obtained in Example 1.

EXAMPLE 24

In accordance with the procedure and condition used in Example 23, an a-Si type layer of 20 microns in thickness was formed on the aluminum substrate. The structure was taken out from the deposition chamber 10, and polycarbonate resin was then coated onto the a-Si type layer to form an electrically insulating layer having a thickness of 15 microns after drying.

To the insulating layer surface of the electrophotographic photosensitive member obtained in the above-mentioned manner was applied negative corona discharge with a power source voltage of 6,000 V as the primary charging for 0.2 sec. so that such surface was charged to a voltage of −2,000 V. Positive corona discharging with a voltage of 5,500 V was carried out as the secondary charging simultaneously with the image exposure in an exposure quantity of 15 lux·sec., and the whole surface of the photosensitive member was then exposed uniformly to form an electrostatic image. This image was developed with a positively charged toner by the cascade method, and the thus developed image was transferred to a transfer paper and fixed so that an image of extremely excellent quality was obtained.

EXAMPLE 25

Photosensitive members were prepared by repeating the same procedure and condition as in Example 20 except that the temperature of the substrate was varied as shown in Table 6 given below. The prepared photosensitive members are indicated by Sample Nos. 37–44 in Table 6.

By using the photosensitive members, the image formation was carried out by employing under the same manner and condition as in Example 22 to form images on transfer papers. The obtained results are as shown in Table 6.

As understood from the results, it is necessary to form the a-Si type layer at a temperature of the substrate ranging from 50° C. to 350° C. for the purpose of achieving the object of the present invention.

TABLE 6

| | | Sample No. | | | | | | |
|---|---|---|---|---|---|---|---|---|
| | | 37 | 38 | 39 | 40 | 41 | 42 | 43 | 44 |
| | | Substrate temp., °C. | | | | | | |
| | | 50 | 100 | 150 | 200 | 250 | 300 | 350 | 400 |
| Image quality | | | | | | | | | |
| Charged polarity | ⊕ | X | Δ | Δ | Δ | X | X | X | X |
| | ⊖ | Δ | ◉ | ◉ | ◉ | o | o | Δ | X |

Image quality is that of transferred image.
◉ Very good; o Good; Δ Acceptable for practical use; X Poor

EXAMPLE 26

Photosensitive members were prepared by repeating the same procedure and condition as in Example 22 except that the temperature of the substrate was varied as shown in Table 7 given below. The prepared photosensitive members are indicated by Sample Nos. 45–52 in Table 7.

By using the photosensitive members, the image formation was carried out under the same condition as in Example 22 to form images on transfer papers. The obtained results are as shown in Table 7.

As understood from the results, it is necessary to form the a-Si type layer at a temperature of the substrate ranging from 50° C. to 350° C. for the purpose of achieving the object of the present invention.

TABLE 7

| | | Sample No. | | | | | | |
|---|---|---|---|---|---|---|---|---|
| | | 45 | 46 | 47 | 48 | 49 | 50 | 51 | 52 |
| | | Substrate temp., °C. | | | | | | |
| | | 50 | 100 | 150 | 200 | 250 | 300 | 350 | 400 |
| Image quality | | | | | | | | | |
| Charged polarity | ⊕ | Δ | ◉ | ◉ | ◉ | o | o | Δ | X |
| | ⊖ | Δ | ◉ | ◉ | ◉ | o | o | Δ | X |

Image quality is that of transferred image.
◉ Very good; o Good; Δ Acceptable for practical use; X Poor

EXAMPLE 27

Photosensitive members were prepared by repeating the same procedure and condition as in Example 23 except that the temperature of the substrate was varied as shown in Table 8 given below. The prepared photosensitive members are indicated by Sample Nos. 53–60 in Table 8.

By using the photosensitive members, the image formation was carried out under the same condition as in Example 23 to form images on transfer papers. The obtained results are as shown in Table 8.

As understood from the results, it is necessary to form the a-Si type layer at a temperature of the substrate ranging from 50° C. to 350° C. for the purpose of achieving the object of the present invention.

TABLE 8

| | | Sample No. | | | | | | |
|---|---|---|---|---|---|---|---|---|
| | | 53 | 54 | 55 | 56 | 57 | 58 | 59 | 60 |
| | | Substrate temp., °C. | | | | | | |
| | | 50 | 100 | 150 | 200 | 250 | 300 | 350 | 400 |
| Image quality | | | | | | | | | |
| Charged polarity | ⊕ | Δ | ◉ | ◉ | ◉ | o | o | Δ | X |
| | ⊖ | X | Δ | Δ | Δ | X | X | X | X |

Image quality is that of transferred image.
◉ Very good; o Good; Δ Acceptable for practical use; X Poor

EXAMPLE 28

Electrophotographic photosensitive members, which are indicated by Sample Nos. 61–65 in Table 9 given below, were prepared by conducting the same procedure under the same condition as in Example 22 except that the flow amount of the $B_2H_6$ gas based on that of the $SiH_4$ gas was varied in order to control the amount of the boron (B) doped into the a-Si type layer to various values as shown in Table 9.

The image formation was effected by employing the photosensitive members under the same condition as in Example 22 to obtain images on transfer papers. The results are shown in Table 9. As clear from the results, with respect to practically usable photosensitive member, it is desired to dope the a-Si type layer with boron (B) in an amount of $10^{-6}$–$10^{-3}$ atomic percent.

TABLE 9

| | Sample No. | | | | |
|---|---|---|---|---|---|
| | 61 | 62 | 63 | 64 | 65 |
| Doping amount of B, atomic % | $10^{-6}$ | $10^{-5}$ | $10^{-4}$ | $10^{-3}$ | 1 |
| Image quality | o | ⊚ | ⊚ | o | X |

Image quality is that of transferred image.
⊚ Very good; o Good; X Poor

EXAMPLE 29

The photosensitive members prepared in Examples 20, 22 and 23 were each allowed to stand in an atmosphere of high temperature and humidity, i.e., at a temperature of 40° C. and relative humidity of 90 RH %. After the lapse of 96 hours, the photosensitive members were taken out into an atmosphere at a temperature of 23° C. and relative humidity of 50 RH %. Immediately thereafter, the same image forming processes as in Examples 20, 22 and 23 were conducted under the same condition by using the photosensitive members to obtain images of sharpness and good quality. This result showed that the photosensitive member of the present invention is very excellent also in moisture resistance.

EXAMPLE 30

An electrophotographic photosensitive member was prepared in the same manner as that in Example 20. To the member was applied negative corona discharge with a power source voltage of 6,000 V in a dark place and the image exposure was then conducted in an exposure quantity of 20 lux-sec. to form an electrostatic image, which was then developed with a liquid developer containing a chargeable toner dispersed in a solvent of an isoparaffin type hydrocarbon. The developed image was transferred to a transfer paper followed by fixing. The fixed image was extremely high in the resolution and of good image quality with sharpness.

Further, the above described image forming process was repeated in order to test the solvent resistance, in other words, liquid developer resistance of the photosensitive member. The foregoing image on the transfer paper was compared with an image on a transfer paper obtained when the image forming process was repeated ten thousand (10,000) times. As a result, no difference was found therebetween, which showed that the photosensitive member of the present invention is excellent in the solvent resistance.

In addition, as the manner of cleaning the photosensitive member surface effected in the image forming process, the blade cleaning method was used, the blade being formed of urethane rubber.

EXAMPLE 31

An electrophotographic photosensitive member was prepared by using the same procedure and condition as in Example 1 except that the temperature of the aluminum substrate was continuously raised from 100° C. to 300° C. for the duration between the start of the a-Si layer formation and the completion thereof.

The same image forming process as in Example 1 was applied to the thus prepared photosensitive member. It was found that the photosensitive member is excellent in light fatigue resistance as compared with that of Example 1. As to the other properties, similar results were obtained.

EXAMPLE 32

An electrophotographic photosensitive member was prepared by repeating the same manner and condition as in Example 1 except that the temperature of the aluminum substrate was controlled as mentioned below. The substrate temperature was adjusted to 100° C. at the time of starting the formation of the a-Si type layer, and then continuously raised as the layer grew so that the temperature was adjusted to 300° C. immediately before expiration of the layer forming duration and subsequently decreased to 280° C. so that the image formation was completed.

The same image forming treatment as in Example 1 was conducted by using the photosensitive member thus prepared. As a result, the photosensitive member was excellent in light fatigue resistance as compared with that obtained in Example 1, and as to other properties, similar results were obtained.

What we claim is:

1. In an apparatus for electrophotography which is capable of charging in the dark an image-forming member for electrophotography, irradiating the charged image-forming member with a light to form an electrostatic image, developing a surface of the light-irradiated image-forming member to form a toner image, transferring the toner image formed on the surface of the image-forming member and cleaning the surface of the image-forming member after transferring the toner image, the improvement which comprises:

(a) an image-forming member for electrophotography comprising a substrate for electrophotography and a photoconductive layer formed on the substrate comprising amorphous silicon containing 10 to 40 atomic percent of hydrogen atoms and having photoconductivity; and (b) a blade which is provided at a position suitable for cleaning a toner on the surface of the image-forming member.

2. The apparatus according to claim 1, wherein the blade comprises a urethane rubber.

3. The apparatus according to claim 1, wherein the substrate is cylindrical.

4. In an apparatus for electrophotography which is capable of charging an image-forming member for electrophotography, irradiating the charged image-forming member with a light to form an electrostatic image corresponding to the light irradiation, developing a surface of the light-irradiated image-forming member to form a toner image, transferring the toner image formed on the image-forming member and cleaning the surface of the image-forming member after transferring the toner image, the improvement which comprises:

(a) an image-forming member for electrophotography comprising a substrate for electrophotography and a photoconductive layer formed on the substrate comprising amorphous silicon containing 10 to 40 atomic percent of hydrogen atoms and having photoconductivity; and (b) a blade for use in the cleaning step which is provided at a position suitable for cleaning a toner on the surface of the image-forming member.

5. The apparatus according to claim 4, wherein the blade comprises a urethane rubber.

6. The apparatus according to claim 4, wherein the substrate is cylindrical.

7. The apparatus according to claim 4, wherein the photoconductive layer has a thickness of 5 to 80 μm.

8. The apparatus according to claim 4, further comprising a covering layer on the photoconductive layer.

9. The apparatus according to claim 4, further comprising a barrier layer between the substrate and the photoconductive layer.

10. The apparatus according to claim 9, wherein the barrier layer comprises silicon atoms and oxygen atoms.

11. The apparatus according to claim 4, wherein the photoconductive layer further contains an impurity for controlling conductivity type.

12. The apparatus according to claim 11, wherein the impurity comprises an element of Group III or V of the Periodic Table.

13. The apparatus according to claim 12, wherein the element of Group III of the Periodic Table is selected from the group consisting of B, Al, Ga, In and Tl.

14. The apparatus according to claim 12, wherein the element of Group V of the Periodic Table is selected from the group of N, P, As, Sb and Bl.

* * * * *

UNITED STATES PATENT AND TRADEMARK OFFICE
CERTIFICATE OF CORRECTION

PATENT NO. : 5,640,663

DATED : June 17, 1997

INVENTOR(S) : YUTAKA HIRAI ET AL.

It is certified that error appears in the above-identified patent and that said Letters Patent is hereby corrected as shown below:

<u>COLUMN 2</u>
  Line 20,   "Phisics" should read --Physics--;
  Line 26,   "No. 4,064,521." should read --No. 4,064,521).--.

<u>COLUMN 4</u>
  Line 11,   "inventions" should read --invention--;
  Line 15,   "and-a" should read --and a--.

<u>COLUMN 5</u>
  Line 12,   "graphic:" should read --graphic--.

<u>COLUMN 9</u>
  Line 47,   "contained-in" should read --contained in--.

<u>COLUMN 11</u>
  Line 35,   "depend-in" should read --depending--.

<u>COLUMN 13</u>
  Line 36,   "appropriate," should read --appropriate--;
  Line 62,   "form" should read --form the--.

<u>COLUMN 16</u>
  Line 21,   "foil, owing" should read --following--;
  Line 43,   "159°C.," should read --150°C.,--.

<u>COLUMN 19</u>
  Line 6,   "bieng" should read --being--.

UNITED STATES PATENT AND TRADEMARK OFFICE
CERTIFICATE OF CORRECTION

PATENT NO. : 5,640,663

DATED : June 17, 1997

INVENTOR(S): YUTAKA HIRAI ET AL.

It is certified that error appears in the above-identified patent and that said Letters Patent is hereby corrected as shown below:

<u>COLUMN 19</u>
  Line 15, "war" should read --was--.

<u>COLUMN 21</u>
  Line 25, "1500" should read --150--;
  Line 30, "to-a" should read --to a--.

<u>COLUMN 25</u>
  Line 11, "being-observed" should read --being observed--.

<u>COLUMN 28</u>
  Line 35, "cascase" should read --cascade--;
  Line 38, "forming-process" should read --forming process--.

<u>COLUMN 30</u>
  Line 28, "durability.," should read --durability.--;
  Line 56, "paper" should read --paper.--.

UNITED STATES PATENT AND TRADEMARK OFFICE
CERTIFICATE OF CORRECTION

PATENT NO. : 5,640,663

DATED : June 17, 1997

INVENTOR(S) : YUTAKA HIRAI ET AL.

It is certified that error appears in the above-identified patent and that said Letters Patent is hereby corrected as shown below:

<u>COLUMN 36</u>
  Line 15, "B1" should read --Bi--.

Signed and Sealed this

Seventeenth Day of March, 1998

Attest:

BRUCE LEHMAN

*Attesting Officer*        Commissioner of Patents and Trademarks